(12) United States Patent
Sakata et al.

(10) Patent No.: US 8,378,393 B2
(45) Date of Patent: Feb. 19, 2013

(54) CONDUCTIVE OXYNITRIDE AND METHOD FOR MANUFACTURING CONDUCTIVE OXYNITRIDE FILM

(75) Inventors: Junichiro Sakata, Atsugi (JP); Tetsunori Maruyama, Atsugi (JP); Yuki Imoto, Atsugi (JP); Yuji Asano, Atsugi (JP); Junichi Koezuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 389 days.

(21) Appl. No.: 12/609,032

(22) Filed: Oct. 30, 2009

(65) Prior Publication Data

US 2010/0109058 A1    May 6, 2010

(30) Foreign Application Priority Data

Oct. 31, 2008    (JP) .................................. 2008-281752

(51) Int. Cl.
*H01L 29/78* (2006.01)
(52) U.S. Cl. ................. 257/288; 257/E29.255; 438/542
(58) Field of Classification Search .................... 257/288
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| CN | 1933205 | 3/2007 |
|---|---|---|
| CN | 101111927 | 1/2008 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Zandra Smith
*Assistant Examiner* — Paul Patton
(74) *Attorney, Agent, or Firm* — Eric J. Robinson; Robinson Intellectual Property Law Office, P.C.

(57) ABSTRACT

An electrode formed using a transparent conductive oxide is likely to be crystallized by heat treatment performed in the manufacturing process of a semiconductor device. In the case of a thin film element using an electrode having a significantly uneven surface due to crystallization, a short circuit is likely to occur and thus reliability of the element is degraded. An object is to provide a light-transmitting conductive oxynitride which is not crystallized even if subjected to heat treatment and a manufacturing method thereof. It is found that an oxynitride containing indium, gallium, and zinc, to which hydrogen atoms are added as impurities, is a light-transmitting conductive film which is not crystallized even if heated at 350° C. and the object is achieved.

25 Claims, 23 Drawing Sheets

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,368,045 B2 | 5/2008 | Vereecken et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,521,269 B2 | 4/2009 | Song |
| 7,674,650 B2 | 3/2010 | Akimoto et al. |
| 7,732,819 B2 | 6/2010 | Akimoto et al. |
| 7,795,050 B2 | 9/2010 | Song |
| 7,868,410 B2 | 1/2011 | Vereecken et al. |
| 8,222,805 B2 | 7/2012 | Zhang et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0227150 A1 | 11/2004 | Nakahara |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0046336 A1* | 3/2006 | Shoji et al. ............... 438/30 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258174 A1* | 10/2008 | Seong ..................... 257/184 |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| CN | 101157854 | 4/2008 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-293693 | 11/1997 |
| JP | 11-505377 | 5/1999 |
| JP | 2000-044236 A | 2/2000 |
| JP | 2000-150900 | 5/2000 |
| JP | 2001-322814 | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |
| WO | WO-2006/080980 | 8/2006 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106.3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9 and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.O et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven Voltage Controlled Amorphous GIZO (Ga2O3-In2O3-ZnO) TFT,", International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase", ", Physics Letters, Sep. 10, 1973, vol. 45A, No. 2, pp. 115-116.

Cho.D at al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.n. et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,'", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev.Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys.Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214tg ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Chinese Office Action (Application No. 200910211814.9; CN11968) Dated Oct. 30, 2012.

* cited by examiner

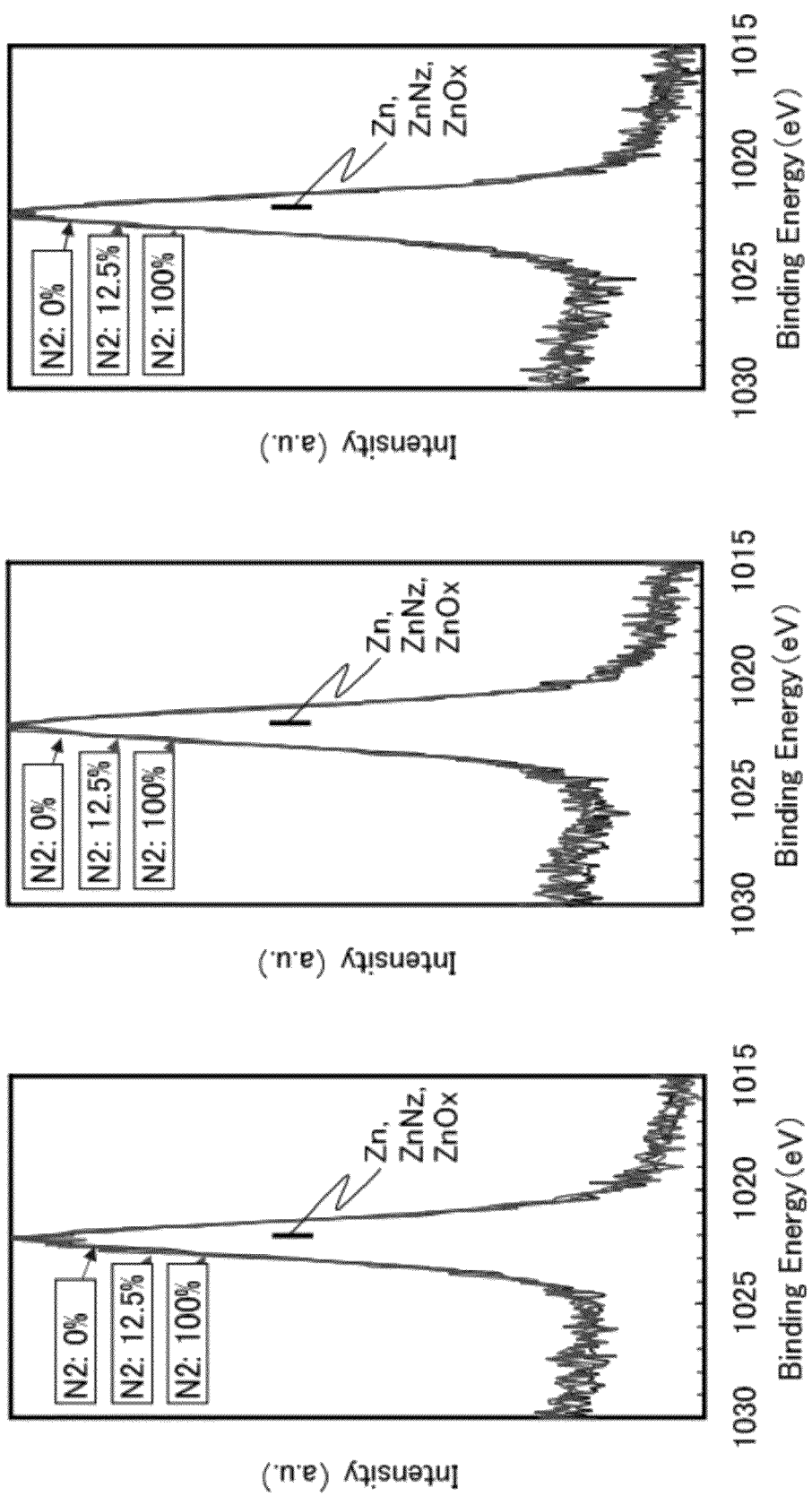

CONDUCTIVE OXYNITRIDE AND METHOD FOR MANUFACTURING CONDUCTIVE OXYNITRIDE FILM

BACKGROUND OF THE INVENTION

1. Field of the Invention

The present invention relates to a conductive oxynitride and a manufacturing method thereof. In particular, the present invention relates to a conductive oxynitride formed using an oxynitride containing indium, gallium, and zinc and a method for manufacturing a conductive oxynitride film.

2. Description of the Related Art

In recent years, flat panel displays (such as liquid crystal display devices, light-emitting display devices, and electrophoretic display devices) have been actively developed. Most of them have a structure in which display or display light is seen through an electrode using a transparent conductive oxide. As a typical example of the transparent conductive oxide, an indium oxide-tin oxide ($In_2O_3$—$SnO_2$) alloy (abbreviated to ITO) film formed using a target obtained by adding tin oxide to indium oxide and performing sintering can be given.

A sputtering method has been widely employed as a method for depositing an indium oxide-tin oxide alloy (ITO) film. It is known that in particular, by depositing an indium oxide-tin oxide alloy (ITO) film in an atmosphere to which hydrogen or water vapor are added, crystallization during the deposition is prevented and thus an amorphous transparent conductive oxide film which is more excellent in workability than a transparent conductive oxide film having crystallinity is formed. Further, it is also known that since hydrogen atoms released from hydrogen or water vapor compensate dangling bonds of other atoms contained in the transparent conductive oxide, electrons trapped by the dangling bonds are reduced and thus the conductance of the transparent conductive oxide film can be increased (Patent Document 1).

REFERENCE

[Patent Document 1] Japanese Publishes Patent Application No. H9-293693

SUMMARY OF THE INVENTION

The method for depositing an indium oxide-tin oxide alloy (ITO) film in an atmosphere to which hydrogen or water vapor are added is effective for suppressing crystallization during the film deposition. However, even an indium oxide-tin oxide alloy (ITO) film deposited by this method is crystallized by heat treatment at high temperatures after the deposition. Specifically, in the case where an indium oxide-tin oxide alloy (ITO) film is heated at temperatures over 200° C. to 250° C., crystallization proceeds.

A light-transmitting conductive film which has been crystallized by heat treatment has significant unevenness on a surface thereof. In the case where the light-transmitting conductive film having the significantly uneven surface is used for an electrode of a thin film element, a short circuit is likely to occur and thus reliability of the element is degraded. Further, since the light-transmitting conductive film which has been crystallized by heat treatment is not easily dissolved in an etchant, it is also a problem that microfabrication is required to be completed before heat treatment and thus the order of steps is restricted.

An object of an embodiment of the present invention is to provide a light-transmitting conductive oxynitride which is not crystallized even if subjected to heat treatment. Further, an object is to provide a method for manufacturing a light-transmitting oxynitride which is not crystallized even if subjected to heat treatment. Note that here, a light-transmitting conductive film through which display or display light can be extracted by being used for an electrode of a flat panel display is referred to as a light-transmitting conductive film or a transparent conductive film.

The present inventors and the like found that an oxynitride film containing indium, gallium, and zinc, which contains hydrogen atoms, forms a light-transmitting conductive oxynitride film which is not crystallized even if subjected to heat treatment and achieved the objects.

A conductive oxynitride used for a light-transmitting conductive film in this specification contains indium, gallium, and zinc. Note that the conductive oxynitride may contain a metal other than gallium, such as nickel or iron, as well as gallium. Further, the oxynitride film may contain Fe, Ni, or any of the other transition metal elements, or an oxide of any of the transition metals as an impurity element. In this specification, the thin film is also referred to as an In—Ga—Zn—O—N non-single-crystal film.

The composition ratio of the In—Ga—Zn—O—N non-single-crystal film depends on a condition of deposition. Further, as for the crystal structure of the In—Ga—Zn—O—N non-single-crystal film, an amorphous structure is observed by X-ray diffraction (XRD) analysis. Note that the In—Ga—Zn—O—N non-single-crystal film is subjected to heat treatment at 200° C. to 500° C., typically 300° C. to 400° C. for 10 to 100 minutes after being deposited by a sputtering method.

Further, an oxynitride refers to the one containing oxygen and nitrogen so that the composition ratios of nitrogen (N) to oxygen (O) (N/O) range from 5 atomic % to 80 atomic %, preferably from 10 atomic % to 50 atomic %.

Nitrogen atoms and hydrogen atoms in the oxynitride containing indium, gallium, and zinc form impurity levels. Nitrogen atoms prevent atoms in the film from being densely filled in the film and facilitate diffusion of hydrogen atoms into the film and intercrystallization of hydrogen atoms into the film. Further, hydrogen atoms are bonded to other atoms in the film and form, for example, a —OH group, a —NH group, a —H group, and the like to compensate dangling bonds and thus increase conductance. Owing to such functions of nitrogen atoms and hydrogen atoms, a light-transmitting conductive oxynitride which is less likely to be crystallized by heat treatment can be obtained.

As an example of a method for manufacturing a light-transmitting conductive film formed using an oxynitride containing indium, gallium, and zinc, which contains hydrogen atoms, a method can be given in which an oxynitride film containing indium, gallium, and zinc is deposited by sputtering a target obtained by sintering an oxide containing indium, gallium, and zinc in an atmosphere containing a nitrogen gas, a compound serving as a supply source of hydrogen atoms is made to adsorb onto the oxynitride film, and then heat treatment is performed so that hydrogen atoms are diffused into the film.

As another method, a method can be given in which the oxynitride is subjected to heat treatment in an atmosphere containing a compound serving as a supply source of hydrogen atoms to the oxynitride film containing indium, gallium, and zinc so that hydrogen atoms are diffused into the film.

As another method, a method can be given in which an oxynitride film containing indium, gallium, and zinc, which contains hydrogen atoms, is deposited by sputtering in an atmosphere containing hydrogen and a nitrogen gas or ammonia a target obtained by sintering an oxide containing indium, gallium, and zinc, and then heat treatment is performed on the oxynitride film containing hydrogen.

A light-transmitting conductive oxynitride film according to an embodiment of the present invention is a conductive oxynitride which is formed using an oxynitride containing indium, gallium, and zinc and contains hydrogen atoms.

According to another embodiment, the conductive oxynitride contains oxygen and nitrogen so that the composition ratios of nitrogen (N) to oxygen (O) (N/O) range from 5 atomic % to 80 atomic %, preferably from 10 atomic % to 50 atomic % and contains hydrogen atoms.

Another embodiment is a method for manufacturing a conductive oxynitride film, in which an oxynitride film containing indium, gallium, and zinc is deposited, a compound serving as a supply source of hydrogen atoms is made to adsorb onto a surface of the oxynitride film, and then heat treatment is performed so that hydrogen atoms are diffused into the oxynitride film.

Another embodiment is a method for manufacturing a conductive oxynitride film, in which an oxynitride film containing indium, gallium, and zinc is deposited, and then heat treatment is performed in an atmosphere containing a compound serving as a supply source of hydrogen atoms so that hydrogen atoms are diffused into the oxynitride film.

Another embodiment is a method for manufacturing a conductive oxynitride film, in which an oxynitride film containing indium, gallium, and zinc is stacked over a film serving as a supply source of hydrogen atoms, and then heat treatment is performed so that hydrogen atoms are diffused into the oxynitride film.

Another embodiment is a method for manufacturing a conductive oxynitride film, in which an oxynitride film containing indium, gallium, and zinc is deposited in an atmosphere containing a compound serving as a supply source of hydrogen atoms to the oxynitride film, and then heat treatment is performed on the oxynitride film.

Another embodiment is a method for manufacturing a conductive oxynitride film, in which hydrogen atoms are diffused into an oxynitride film containing indium, gallium, and zinc deposited by sputtering a target made from an oxide containing indium, gallium, and zinc in an atmosphere containing a nitrogen gas.

According to an embodiment of the present invention, a light-transmitting conductive oxynitride which is not crystallized even if subjected to heat treatment can be provided. Further, a method for manufacturing a light-transmitting conductive oxynitride film which is not crystallized even if subjected to heat treatment can be provided.

BRIEF DESCRIPTION OF THE DRAWINGS

Table 1 shows deposition atmospheres and electric conductivities of films each containing indium, gallium, and zinc.

FIGS. 7A1 and 7A2, and 7B are top views and a cross-sectional view each illustrating a semiconductor device according to an embodiment of the present invention.

FIGS. 23A to 23C each show results obtained by measuring films each containing indium, gallium, and zinc by XPS.

DETAILED DESCRIPTION OF THE INVENTION

Figure 1:
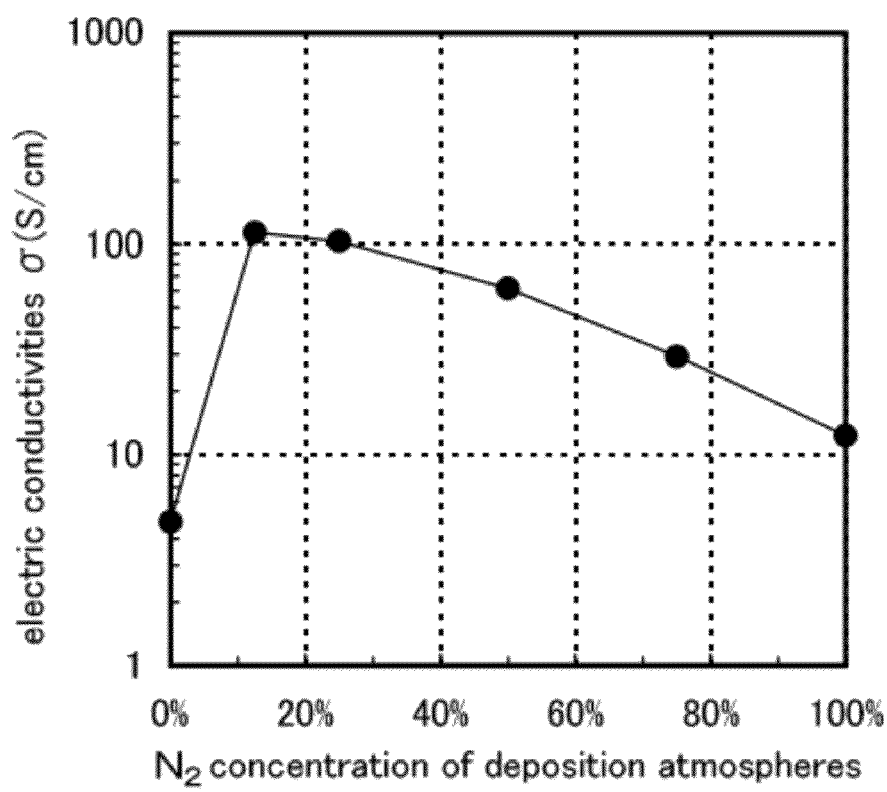
FIG. 1 shows deposition atmospheres and electric conductivities of films each containing indium, gallium, and zinc.

The embodiments and examples of the present invention will be described in detail with reference to drawings. Note that the present invention is not limited to the description below, and it is apparent to those skilled in the art that modes and details can be modified in various ways without departing from the spirit and scope of the present invention. Accordingly, the present invention should not be construed as being limited to the description of the embodiments and examples given below. Note that in the structures of the present invention described below, like reference numerals refer to like portions or portions having similar functions, and the description thereof is omitted.

Embodiment 1

This embodiment will describe a light-transmitting conductive oxynitride film which is an embodiment of the present invention and a manufacturing method thereof. Specifically, described will be a method for manufacturing a light-transmitting conductive oxynitride film, in which an oxynitride film containing indium, gallium, and zinc is deposited in an atmosphere containing a nitrogen gas, a compound serving as a supply source of hydrogen atoms is made to adsorb onto a surface of the oxynitride film, and then heat treatment is performed.

A substrate over which a conductive oxynitride is deposited is not particularly limited as long as it can withstand a process temperature of this manufacturing process.

For example, a non-alkali glass substrate manufactured by a fusion method or a float method, such as a substrate of barium borosilicate glass, aluminoborosilicate glass, or aluminosilicate glass, a ceramic substrate, a plastic substrate, or the like can be used. Further, a glass substrate containing barium oxide (BaO) and boric acid ($B_2O_3$) so that the amount of BaO is larger than that of $B_2O_3$ and having a strain point of 730° C. or higher is preferably used. This is because the glass substrate can be prevented from being strained even in the case where there is a step of performing heat treatment at a high temperature of about 700° C. Alternatively, a substrate obtained by providing an insulating film over a surface of a metal substrate of a stainless steel alloy or the like.

Further, a light-transmitting conductive oxynitride film according to an embodiment of the present invention can be used as a material of an electrode of a thin film element. For example, a light-transmitting conductive oxynitride film according to an embodiment of the present invention can be utilized by being formed over a protective film or a planarization film formed over a thin film transistor.

Alternatively, a substrate over which a film serving as a supply source of hydrogen atoms to oxynitride is formed on the side where the conductive oxynitride film is to be deposited may be used. As the film serving as a supply source of hydrogen atoms to oxynitride, a film having a hydroxyl group such as a —SiOH group or a —AlOH group or a film to which hydrogen is added can be used. Further, a silanol group of a surface of a substrate and a small amount of substance such as an adsorbed water molecule are each also a supply source of hydrogen atoms from the substrate to the oxynitride film.

Next, a conductive oxynitride is deposited over the substrate. The deposition is performed in an atmosphere containing nitrogen to form an oxynitride film containing indium, gallium, and zinc. Specifically, the deposition is performed by a sputtering method in an atmosphere containing a nitrogen gas so that the composition ratios of nitrogen (N) to oxygen (O) (N/O) in the oxynitride film containing indium, gallium, and zinc range from 5 atomic % to 80 atomic %, preferably from 10 atomic % to 50 atomic %.

Here, the deposition is performed in an atmosphere of a mixed gas of argon and nitrogen with the use of a target of 12 inch in diameter obtained by sintering an oxide containing indium, gallium, and zinc ($In_2O_3:Ga_2O_3:ZnO=1:1:1$) under the condition that the distance between the substrate and the target is 60 mm, the pressure is 0.4 Pa, and the DC power is 0.5 kW. The thicknesses of the oxynitride film range from 20 nm to 100 nm. In this embodiment, the thickness of the oxynitride film is 50 nm. Note that pulse DC power is preferably used because dust can be reduced and film thickness distribution is uniform.

When the nitrogen concentration in the deposition atmosphere is too low, the rate of nitrogen in the oxynitride film containing indium, gallium, and zinc is low. When the amount of nitrogen introduced is too small, the amount of nitrogen substituted for oxygen in the film is small and thus generation of carriers is not enough; therefore, electric conductivity cannot be sufficiently increased even if heat treatment is performed in the following step.

Further, when the nitrogen concentration in the deposition atmosphere is too high, the rate of nitrogen in the oxynitride film containing indium, gallium, and zinc is too high. When the amount of nitrogen introduced is too large, the amount of nitrogen substituted for oxygen in the film is large and thus defects are increased; therefore, electric conductivity cannot be sufficiently increased even if heat treatment is performed in the following step. That is why the nitrogen concentration in the deposition atmosphere has an appropriate range.

Next, the oxynitride film containing indium, gallium, and zinc is exposed to a compound serving as a supply source of hydrogen atoms. Examples of the compound serving as a supply source of hydrogen atoms to the oxynitride film are a hydrogen gas, water, ammonia, and hydrocarbon such as alcohol. Here, the substrate is carried out of a deposition chamber to the air and then the oxynitride film containing indium, gallium, and zinc is exposed to water vapor in the air. As a result, a water molecule in the air is adsorbed to an atom of a surface of the oxynitride film, such as an oxygen atom.

Next, the oxynitride film containing indium, gallium, and zinc which has been exposed to the air is subjected to heat treatment at 200° C. to 600° C., typically 300° C. to 500° C. Here, the heat treatment is performed in a nitrogen atmosphere at 350° C. for an hour. Note that the atmosphere for heat treatment is not limited to a nitrogen atmosphere and heat treatment may be performed in the air or an oxygen atmosphere.

By this heat treatment, hydrogen atoms are diffused into the oxynitride film containing indium, gallium, and zinc from the substance adsorbed onto the surface of the oxynitride film. This heat treatment involves the rearrangement of the oxynitride film containing indium, gallium, and zinc at the atomic level. This heat treatment (including light annealing) is important because the strain that inhibits the movement of carriers can be released by the heat treatment.

The conductance of the oxynitride film containing indium, gallium, and zinc into which hydrogen atoms are diffused is increased, so that a light-transmitting conductive film is formed. Note that the timing when the heat treatment is performed is not particularly limited as long as it is after the deposition of the oxynitride film. For example, the heat treatment may be performed after microfabrication by etching.

A light-transmitting conductive film according to an embodiment of the present invention can be microfabricated by a photolithography method. Specifically, unnecessary part of the oxynitride film containing indium, gallium, and zinc is removed by etching with the use of a resist mask formed using a photomask, so that a light-transmitting conductive layer can be formed. Wet etching is not necessarily employed for the etching of the oxynitride film containing indium, gallium, and zinc. Alternatively, dry etching may be employed.

Here, unnecessary part of the oxynitride film containing indium, gallium, and zinc is removed by wet etching using ITO07N (manufactured by Kanto Chemical Co., Inc.). Through the above steps, the light-transmitting conductive layer microfabricated can be formed.

The conductive oxynitiride film described in this embodiment as an example has conductance even after being subjected to heat treatment at 350° C. and is not crystallized even if processed at high temperatures of 250° C. to 700° C., so that planarity and solubility in an etchant are not reduced. Thus, according to this embodiment, the light-transmitting conductive film can have a high heat resistance.

Embodiment 2

This embodiment will describe a light-transmitting conductive oxynitride film which is an embodiment of the present invention and a manufacturing method thereof. Specifically, described will be a method for manufacturing a conductive oxynitride film, in which an oxynitride film containing indium, gallium, and zinc is deposited in an atmosphere containing a nitrogen gas, and then heat treatment is performed on the oxynitride film in an atmosphere containing a compound serving as a supply source of hydrogen atoms.

The oxynitride film containing indium, gallium, and zinc is deposited over a substrate in a manner similar to that of Embodiment 1.

Next, the substrate over which the oxynitride film containing indium, gallium, and zinc is deposited is carried out of a deposition chamber to a furnace for heat treatment without being exposed to the air. Specifically, a multi-chamber apparatus where the deposition chamber is connected to a heat treatment chamber with a load lock chamber therebetween is used. By performing the heat treatment without exposure to the air, following the deposition, the amount of compound serving as a supply source of hydrogen atoms to the oxynitride film containing indium, gallium, and zinc can be precisely controlled. Further, contamination due to impurity elements or dust floating in the air can be prevented.

The substrate over which the oxynitride film containing indium, gallium, and zinc is deposited is subjected to heat treatment at 200° C. to 600° C., typically 300° C. to 500° C. in an atmosphere containing water vapor and hydrogen in the furnace for heat treatment. Here, heat treatment is performed in a nitrogen atmosphere containing water vapor at 350° C. for an hour. Note that a gas for attenuating water vapor and hydrogen is not limited to nitrogen and the heat treatment may be performed in an argon gas atmosphere or an oxygen atmosphere.

By this heat treatment, nitrogen atoms contained in the oxynitride film containing indium, gallium, and zinc take hydrogen atoms from water vapor and hydrogen adsorbed to the surface of the oxynitride film in the film. Further, this heat treatment involves the rearrangement in the oxynitride film containing indium, gallium, and zinc at the atomic level. This heat treatment (including light annealing) is important because the strain that inhibits the movement of carriers can be released by the heat treatment.

The conductance of the oxynitride film containing indium, gallium, and zinc into which hydrogen atoms are diffused is increased, so that a light-transmitting conductive film is formed. Note that the timing when the heat treatment is performed is not particularly limited as long as it is after the deposition of the oxynitride film. For example, the heat treatment may be performed after microfabrication by etching.

Next, the light-transmitting conductive layer microfabricated can be formed by removing unnecessary part by etching in a manner similar to that of Embodiment 1.

The conductive oxynitride film formed according to this embodiment has conductance even after being subjected to heat treatment at 350° C. and is not crystallized even if processed at high temperatures of 250° C. to 700° C., so that planarity and solubility in an etchant are not reduced. Thus, according to this embodiment, the light-transmitting conductive film can have high heat resistance.

Embodiment 3

This embodiment will describe a light-transmitting conductive oxynitride film which is an embodiment of the present invention and a manufacturing method thereof. Specifically, described will be a method for manufacturing a conductive oxynitride film, in which an oxynitride film containing hydrogen, indium, gallium, and zinc is deposited in an atmosphere containing nitrogen and a compound serving as a supply source of hydrogen atoms, and then heat treatment is performed.

A substrate similar to that of Embodiment 1 is used. The oxynitride film containing indium, gallium, and zinc into which hydrogen is diffused is deposited in an atmosphere containing hydrogen and nitrogen.

Specifically, the deposition is performed by a sputtering method in an atmosphere containing a hydrogen gas and a nitrogen gas so that the composition ratios of nitrogen (N) to oxygen (O) (N/O) in the oxynitride film containing indium, gallium, and zinc range from 5 atomic % to 80 atomic %, preferably from 10 atomic % to 50 atomic %. Note that by adding a hydrogen gas of 0.1% by volume to 10% by volume to the deposition atmosphere, hydrogen atoms can be contained in the oxynitride film.

Here, the deposition is performed in an atmosphere of a mixed gas containing hydrogen (6% by volume), nitrogen (10% by volume), and argon (84% by volume) with the use of a target and a sputtering apparatus similar to those of Embodiment 1. Note that instead of a hydrogen gas, water vapor, ammonia, or hydrocarbon such as alcohol, which is attenuated, may be used as the compound serving as a supply source of hydrogen atoms to the oxynitride film.

In this embodiment, the oxynitride film containing indium, gallium, and zinc made to contain hydrogen is deposited by a sputtering method. Heat treatment is performed after the deposition so that rearrangement of atoms is facilitated.

The conductance of the oxynitride film containing indium, gallium, and zinc into which hydrogen atoms are diffused is increased, so that a light-transmitting conductive film is formed. Note that the timing when the heat treatment is performed is not particularly limited as long as it is after the deposition of the oxynitride film containing indium, gallium, and zinc, which contains hydrogen atoms. For example, heat treatment may be performed after microfabrication by etching.

Next, the light-transmitting conductive layer is formed by removing unnecessary part by etching in a manner similar to that of Embodiment 1.

The conductive oxynitride film formed according to this embodiment has conductance even after being subjected to heat treatment at 350° C. and is not crystallized even if processed at high temperatures of 250° C. to 700° C., so that planarity and solubility in an etchant are not reduced. Thus, according to this embodiment, the light-transmitting conductive film can have high heat resistance.

Embodiment 4

This embodiment will describe an example of a liquid crystal display device where a conductive oxynitride according to an embodiment of the present invention is applied to a flat panel display.

Here, the case will be described in which a display device is manufactured by applying a so-called active matrix substrate obtained by forming a transparent pixel electrode using a conductive oxynitride film according to an embodiment of the present invention and forming a pixel portion and a driver circuit over one substrate by using a thin film transistor.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying a current to the display element in each of a plurality of pixels.

Specifically, the element substrate may be in a state after only a pixel electrode of the display element to which a light-transmitting conductive film of an embodiment of the present invention is applied is formed, a state after a light-transmitting conductive film of an embodiment of the present invention to be a pixel electrode is formed and before the conductive film is etched to form the pixel electrode, or any of the other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

Figure 7B:
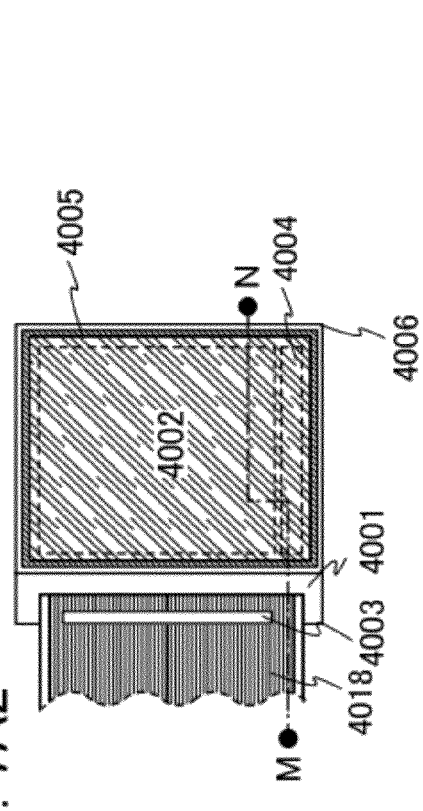
Figure 7B:
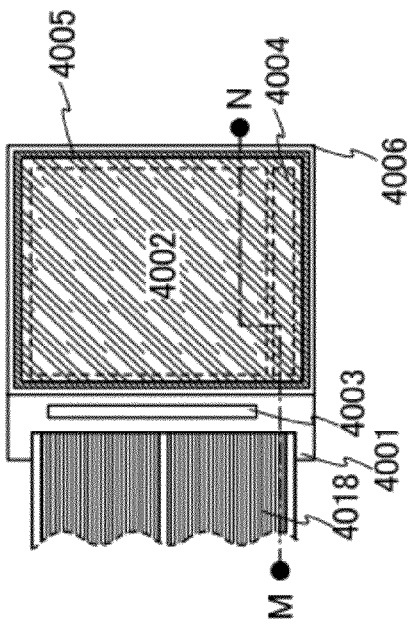
Figure 7B:
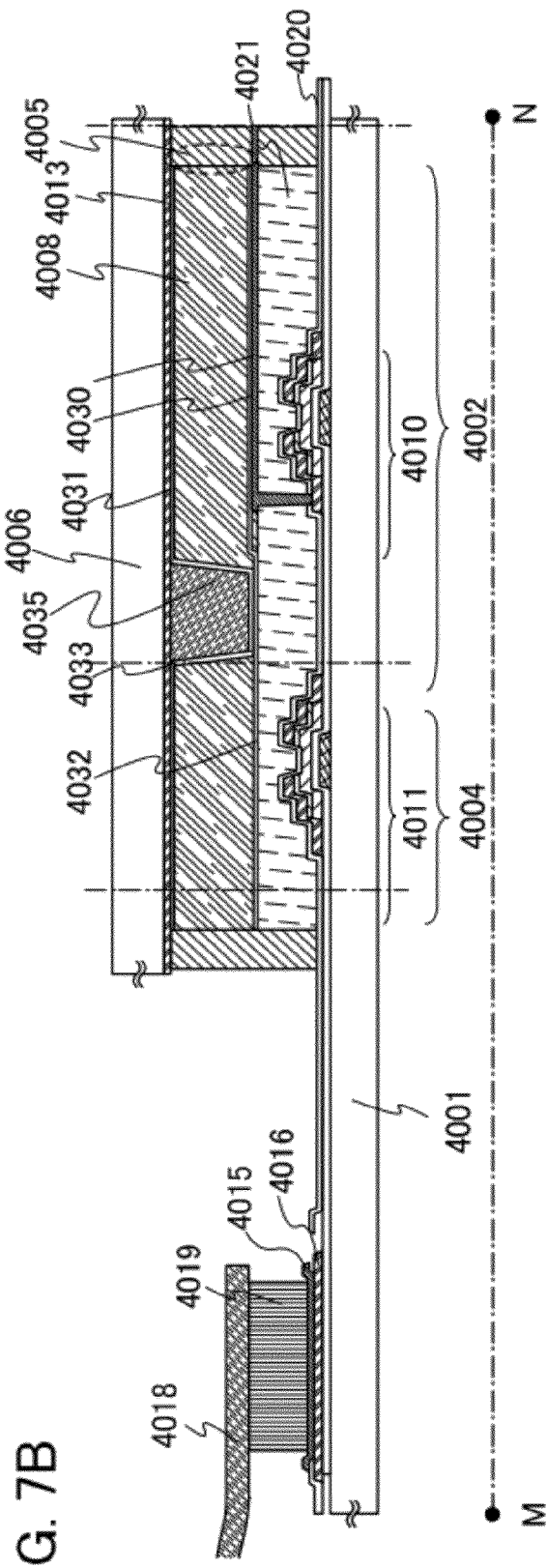

In this embodiment, a display device including a conductive layer to which a conductive oxynitride film according to an embodiment of the present invention is applied will be described. Specifically, the appearance and the cross section of a liquid crystal display panel including a conductive layer to which a conductive oxynitride film according to an embodiment of the present invention is applied will be described with reference to FIGS. 7A1, 7A2, and 7B. FIGS. 7A1 and 7A2 are each a top view of a panel in which a liquid crystal material is sealed between a second substrate 4006 and a pixel electrode layer 4030 connected to a source or drain electrode layer of a thin film transistor 4010 formed over a first substrate 4001 with a sealant 4005. FIG. 7B is a cross-sectional view taken along line M-N of FIGS. 7A1 and 7A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 7A1 illustrates an example of mounting the signal line driver circuit 4003 by a COG method, and FIG. 7A2 illustrates an example of mounting the signal line driver circuit 4003 by a TAB method.

The pixel portion 4002 and the scan line driver circuit 4004 provided over the first substrate 4001 each include a plurality of thin film transistors. FIG. 7B illustrates, as an example, the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, thin film transistors each including amorphous silicon, low-temperature polysilicon, an oxide semiconductor containing indium, gallium, and zinc, or the like for a channel formation layer may be employed. In this embodiment, the thin film transistors 4010 and 4011 are n-channel thin film transistors.

A pixel electrode layer 4030 included in the liquid crystal element 4013 is formed using a light-transmitting conductive film using an oxynitride film containing indium, gallium, and zinc, which contains hydrogen atoms. The pixel electrode layer 4030 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 are overlapped with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010, through conductive particles. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while the temperature of a cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition which includes a liquid crystal showing a blue phase and a chiral agent has small response times of 10 µs to 100 µs, has optical isotropy, which makes the alignment process unneeded, and has a small viewing angle dependence.

Although an example of a transmissive liquid crystal display device is described in this embodiment, an embodiment of the present invention can also be applied to a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor is covered with the insulating layers (the insulating layer 4020 and the insulating layer 4021) serving as a protective film or a planarizing insulating film. Note that the protective film is provided to prevent entry of contaminating impurities floating in the air, such as an organic substance, a metal substance, or water vapor, and is preferably a dense film. The protective film may be formed by a sputtering method to have a single-layer structure of a silicon oxide film, a silicon nitride film, a silicon oxynitride film, a silicon nitride oxide film, an aluminum oxide film, an aluminum nitride film, an aluminum oxynitride film, or an aluminum nitride oxide film, or a layered structure including any of the above films. Although this embodiment describes an example of forming the protective film by a sputtering method, the present invention is not limited to this method and any of a variety of methods may be employed.

In this embodiment, the insulating layer 4020 having a layered structure is formed as the protective film. As a first layer of the insulating layer 4020, a silicon oxide film is formed by a sputtering method. The use of the silicon oxide film as the protective film has an effect of preventing a hillock of an aluminum film used for the source and drain electrode layers.

The insulating layer is also formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical characteristics of the TFT.

The insulating layer 4021 is formed as the planarizing insulating film. For the insulating layer 4021, an organic material having heat resistance, such as polyimide, acrylic, polyimide, benzocyclobutene, polyamide, or epoxy, can be used. Alternatively, used may be a low-dielectric constant material (a low-k material), a siloxane-based resin, PSG (phosphosilicate glass), BPSG (borophosphosilicate glass), or the like. A siloxane-based resin may include as a substituent at least one of fluorine, an alkyl group, and an aryl group, as well as hydrogen. Note that the insulating layer 4021 may be formed by stacking a plurality of insulating films formed using these materials.

Note that a siloxane-based resin is a resin formed from a siloxane-based material as a starting material and having the bond of Si—O—Si.

There is no particular limitation on the method for forming the insulating layer 4021, and the insulating layer 4021 can be formed, depending on the material, by a sputtering method, an SOG method, spin coating, dipping, spray coating, a droplet discharging method (e.g., an ink-jet method, screen printing, or offset printing), doctor knife, roll coater, curtain coater, knife coater, or the like.

Both or at least one of the pixel electrode layer 4030 and the counter electrode layer 4031 is formed from a light-transmitting conductive film using an oxynitride film containing indium, gallium, and zinc, which contains hydrogen atoms, by any of the methods described in Embodiments 1 to 3.

The pixel electrode layer 4030 or the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the counter electrode layer 4031.

As the conductive macromolecule, a so-called π-electron conjugated conductive macromolecule can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, and the scan line driver circuit 4004 or the pixel portion 4002 from an FPC 4018.

In this embodiment, a connecting terminal electrode 4015 is formed using the same conductive film as that of the pixel electrode layer 4030 included in the liquid crystal element 4013, and a terminal electrode 4016 is formed using the same conductive film as that of source and drain electrode layers of the thin film transistors 4010 and 4011.

The connecting terminal electrode 4015 is electrically connected to a terminal included in the FPC 4018 through an anisotropic conductive film 4019.

FIGS. 7A1, 7A2, and 7B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 8:
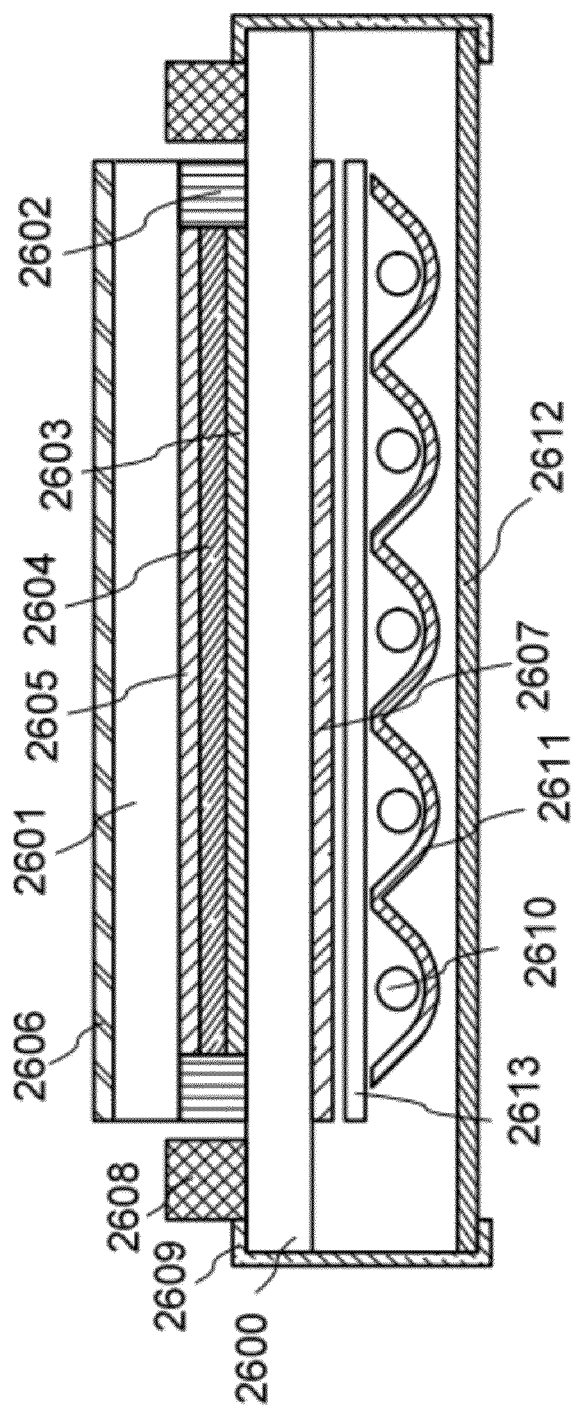
FIG. 8 is a cross-sectional view illustrating a semiconductor device according to an embodiment of the present invention.

FIG. 8 illustrates an example of a liquid crystal display module which is formed as a semiconductor device by using a TFT substrate 2600 manufactured by applying an embodiment of the present invention.

FIG. 8 illustrates an example of a liquid crystal display module, in which the TFT substrate 2600 and a counter substrate 2601 are bonded to each other with a sealant 2602, and a pixel portion 2603 including a pixel electrode formed using a conductive oxynitride, or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a liquid crystal display panel can be manufactured. Since the light-transmitting conductive film formed using an oxynitride film containing indium, gallium, and zinc, which contains hydrogen, has heat resistance, the reliability of a light-emitting device is not degraded due to heat treatment at the time of forming an alignment film over a pixel electrode. Thus, the liquid crystal display panel can have high reliability.

This embodiment can be implemented in appropriate combination with any of the structures described in the other embodiments.

Embodiment 5

Figure 9A:
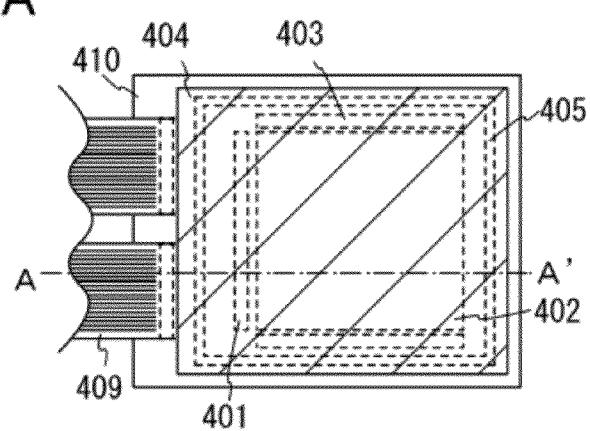
FIGS. 9A and 9B are views illustrating a light-emitting device according to an embodiment of the present invention.
Figure 9B:
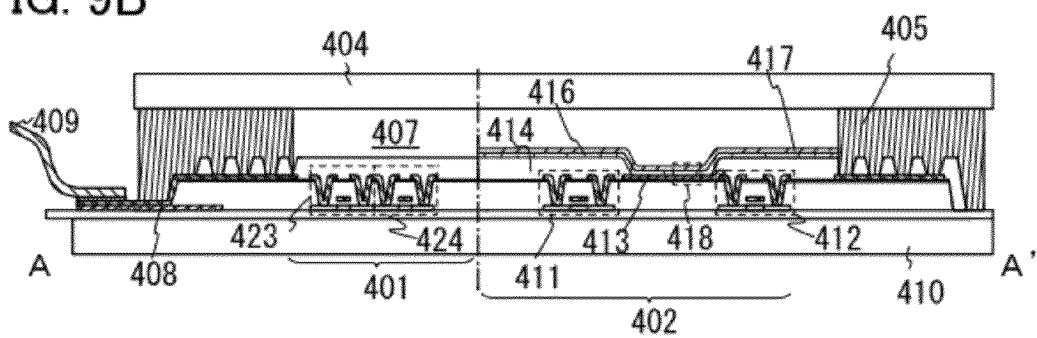

This embodiment will describe a light-emitting device including a pixel electrode using a conductive oxynitride with reference to FIGS. 9A and 9B. Note that FIG. 9A is a top view of the light-emitting device, and FIG. 9B is a cross-sectional view taken along line A-A' of FIG. 9A. Reference numerals 401, 402, and 403 denote a driver circuit portion (a source driver circuit), a pixel portion, and a driver circuit portion (a gate driver circuit), respectively, which are indicated by dotted lines. Further, reference numeral 404 denotes a sealing substrate and reference numeral 405 denotes a sealant. A portion surrounded by the sealant 405 is a space 407.

Note that a lead wiring 408 is a wiring for transmitting signals to be input into the source driver circuit 401 and the gate driver circuit 403 and for receiving signals such as a video signal, a clock signal, a start signal, and a reset signal from an FPC (flexible printed circuit) 409 serving as an external input terminal. Although only the FPC is illustrated here, this FPC may be provided with a printed wiring board (PWB). The light-emitting device in this specification refers to not just a light-emitting device itself but a light-emitting device provided with an FPC or a PWB.

Next, a cross-sectional structure will be described with reference to FIG. 9B. Among the driver circuit portions and the pixel portion including a plurality of pixels, which are formed over a substrate 410, the source driver circuit 401 which is a driver circuit portion and one of the plurality of pixels in the pixel portion 402 are illustrated here.

Note that a CMOS circuit in which an n-channel TFT 423 and a p-channel TFT 424 are formed in combination is formed in the source driver circuit 401. The driver circuit may be formed by a variety of CMOS circuits, PMOS circuits, or NMOS circuits. Although the driver integrated device which has the driver circuit formed over the substrate is described in this embodiment, the driver circuit is not necessarily formed over the substrate. It is also possible to form the driver circuit not over the substrate but outside the substrate.

Moreover, the pixel portion 402 includes a plurality of pixels including a switching TFT 411, a current control TFT 412, and a first electrode 413 electrically connected to a drain of the current control TFT 412. Note that an insulator 414 is formed covering an end of the first electrode 413. Here, a positive photosensitive acrylic resin film is used for the insulator 414.

In order to improve the coverage, the insulator 414 is formed to have a curved surface with a curvature at its upper or lower end portion. For example, in the case of using positive photosensitive acrylic as a material of the insulator 414, only the upper end portion of the insulator 414 preferably has a curved surface with a radius of curvature (0.2 μm to 3 μm). Further, the insulator 414 can be formed using either a negative type that becomes insoluble in an etchant by light irradiation or a positive type that becomes soluble in an etchant by light irradiation.

The reliability of a light-emitting element is significantly adversely affected by water, oxygen, and other impurities remaining in a space in the element or a component such as the insulator 414. For example, in the case where the insulator 414 is formed with macromolecules, it is necessary to perform heat treatment at high temperatures to completely harden the insulator 414 so that impurities are prevented from being precipitated while the light-emitting element is used. Further, it is also necessary to perform heat treatment on the substrate over which a layer 416 containing a light-emitting substance is not yet formed to remove as many impurities as possible.

That is why the first electrode 413 needs to have heat resistance. If the first electrode 413 has a poor heat resistance, for example, crystallization proceeds due to heat treatment for removing impurities and thus surface unevenness becomes significant. When the surface unevenness of the first electrode 413 is significant, a short circuit of the light-emitting element is likely to occur and thus the reliability is reduced. To solve such problems, in this embodiment, the first electrode 413 is formed using an oxynitride film containing indium, gallium, and zinc, which contains hydrogen atoms.

The layer 416 containing a light-emitting substance and a second electrode 417 are formed over the first electrode 413. The layer 416 containing a light-emitting substance can be formed by an evaporation method using an evaporation mask or a wet process such as an inkjet method or a spin coating method.

Although the layer 416 containing a light-emitting substance is generally formed to have a single-layer structure or a layered structure of an organic compound, in an embodiment of the present invention, a structure may be employed in which an inorganic compound is used for part of a film formed using an organic compound. Further, to facilitate injection of holes from the first electrode 413 to the layer 416 containing a light-emitting substance, a hole injecting layer may be provided between the first electrode 413 and the layer 416 containing a light-emitting substance.

Further, as a material used for the second electrode 417, which is formed over the layer 416 containing a light-emitting substance, a material having a low work function (Al, Ag, Li, Ca, or an alloy or compound thereof such as MgAg, MgIn, AlLi, or $CaF_2$, calcium nitride, or calcium fluoride) is preferably used. In the case where light generated in the layer 416 containing a light-emitting substance passes through the second electrode 417 functioning as a cathode, the second electrode 417 is preferably formed using a stack of a thin metal film having a reduced thickness and a transparent conductive film (such as an indium oxide-tin oxide alloy (ITO), an indium oxide-zinc oxide alloy ($In_2O_3$—ZnO), or zinc oxide (ZnO)).

By attaching the sealing substrate 404 to the element substrate 410 using the sealant 405, the light-emitting element 418 is provided in the space 407 which is surrounded by the substrate 410, the sealing substrate 404, and the sealant 405. Note that the space 407 is filled with an inert gas (such as nitrogen or argon) or the sealant 405.

Note that an epoxy-based resin is preferably used for the sealant 405. In addition, it is desirable to use a material that allows permeation of moisture or oxygen as little as possible. As the sealing substrate 404, a glass substrate, a quartz substrate, or a plastic substrate formed from fiberglass-reinforced plastics (FRP), polyvinyl fluoride (PVF), polyester, an acrylic resin, or the like can be used.

Since the light-emitting device using a conductive oxynitride according to an embodiment of the present invention for a pixel electrode includes the first electrode 413 having high heat resistance, the substrate can be subjected to heat treatment sufficiently before the formation of the layer 416 containing a light-emitting substance. Thus, water, oxygen, and other impurities remaining in the light-emitting element can be reduced, so that the light-emitting device can have high reliability.

Figure 10A:
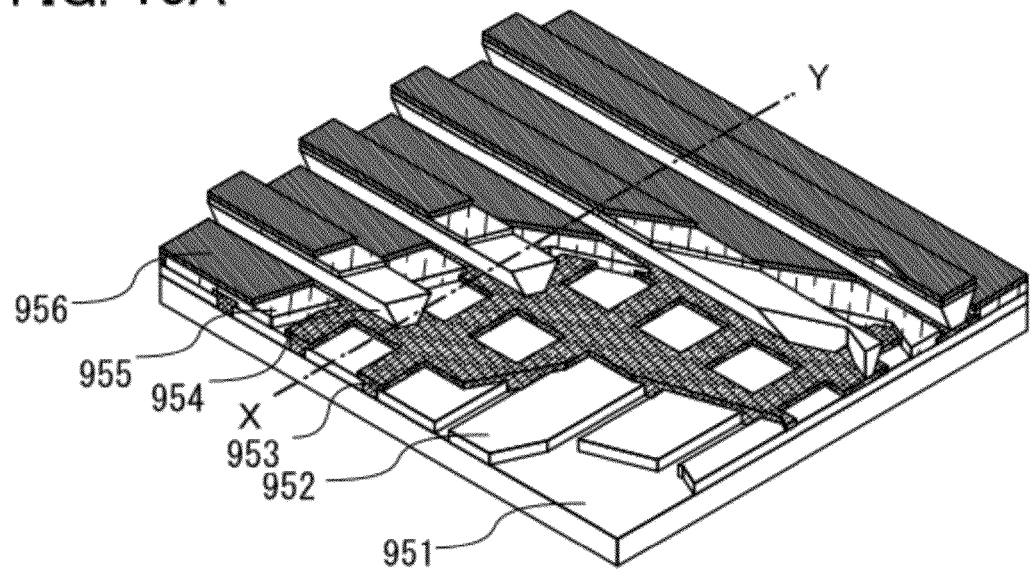
FIGS. 10A and 10B are views illustrating a light-emitting device according to an embodiment of the present invention.
Figure 10B:
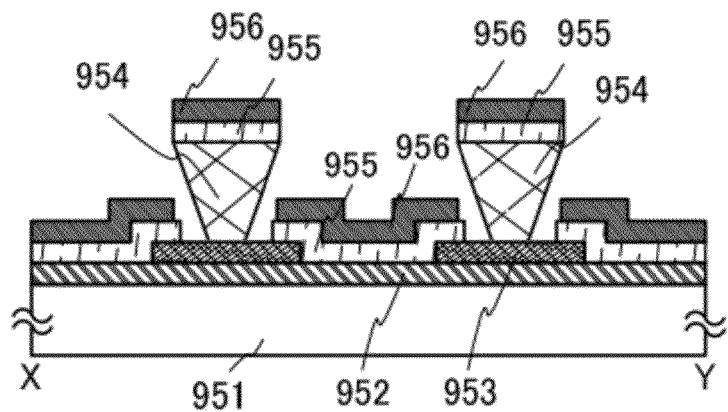

Although an active matrix light-emitting device in which driving of a light-emitting element is controlled with a transistor is described in this embodiment, a passive matrix light-emitting device may alternatively be used. FIGS. 10A and 10B illustrate a passive matrix light-emitting device manufactured by applying an embodiment of the present invention. Note that FIG. 10A is a perspective view of a passive matrix light-emitting device, and FIG. 10B is a cross-sectional view taken along line X-Y of FIG. 10A. In FIGS. 10A and 10B, an electrode 952 is formed over the substrate 951 with the use of an oxynitride film containing indium, gallium, and zinc, which contains hydrogen atoms, and an electrode 956 is provided over the electrode 952 with a layer 955 containing a light-emitting substance interposed therebetween. An edge portion of the electrode 952 is covered with an insulating layer 953. A partition layer 954 is provided over the insulating layer 953.

The sidewalls of the partition layer 954 are aslope so that the distance between the sidewalls is gradually reduced toward the surface of the substrate. That is, a cross section in a short-side direction of the partition layer 954 is a trapezoidal shape, and the bottom side (the side in a direction similar to a plane direction of the insulating layer 953 and in contact with the insulating layer 953) is shorter than the top side (the side in a direction similar to the plane direction of the insulating layer 953 and not in contact with the insulating layer 953). By the provision of the partition layer 954 in this manner, defects of the light-emitting element due to static electricity or the like can be prevented.

Also in the case of a passive matrix light-emitting device, the reliability of the device is significantly adversely affected by water, oxygen, and other impurities remaining in an element. Therefore, it is important to perform heat treatment on the substrate after the formation of the partition layer and before the formation of the layer containing a light-emitting substance and thus the electrode 952 needs to have heat resistance.

Since the passive matrix light-emitting device using a conductive oxynitride according to an embodiment of the present invention for a pixel electrode has the electrode 952 having a high heat resistance, the substrate can be subjected to heat treatment sufficiently before the formation of the layer 955 containing a light-emitting substance. Thus, water, oxygen, and other impurities remaining in the light-emitting element can be reduced, so that the light-emitting device can have high reliability.

EXAMPLE 1

This example will describe a conductive oxynitride film manufactured by a method similar to that of Embodiment 1.

In this example, a 0.7 mm-thick non-alkali glass substrate (EAGLE2000 manufactured by Corning, Inc.) is used as a substrate. Next, an oxynitride film containing indium, gallium, and zinc is deposited over the substrate by a sputtering method using a target of 12 inch in diameter obtained by sintering indium oxide, gallium oxide, and zinc oxide ($In_2O_3$:$Ga_2O_3$:$ZnO$=1:1:1), and setting the distance between the substrate and the target to be 60 mm. The deposition is performed in atmospheres in which argon and nitrogen are mixed at various mixture ratios, by a sputtering method under the condition that the pressure is 0.4 Pa and the DC power is 0.5 kW. Note that the thicknesses of the oxynitride film containing indium, gallium, and zinc range from 50 nm to 1000 nm.

Next, after the substrate is carried out of a deposition chamber and exposed to the air, heat treatment is performed for an hour in a furnace where the temperature is 350° C. and the atmosphere is a nitrogen atmosphere. Note that regardless of whether or not heat treatment is performed, the oxynitride containing indium, gallium, and zinc transmits visible light and has transparence needed for manufacturing a display element.

The electric conductivity before and after heat treatment of the oxynitride film containing indium, gallium, and zinc deposited over the substrate to a thickness of 50 nm is measured by a four-probe method. The measured electric conductivity and the deposition atmosphere are shown in Table 1.

TABLE 1

| sample number | deposition atmospheres | | concentration of $N_2$ % | conductivity of before heat treatment (S/cm) | conductivity of after heat treatment (S/cm) |
| --- | --- | --- | --- | --- | --- |
| | Ar (sccm) | $N_2$ (sccm) | | | |
| 1 | 40 | 0 | 0.0% | $2 \times 10^{-2}$ | 4.8 |
| 2 | 35 | 5 | 12.5% | $<10^{-2}$ | 113.2 |
| 3 | 30 | 10 | 25.0% | $<10^{-2}$ | 103.0 |
| 4 | 20 | 20 | 50.0% | $<10^{-2}$ | 61.4 |
| 5 | 10 | 30 | 75.0% | $<10^{-2}$ | 29.2 |
| 6 | 0 | 40 | 100.0% | $<10^{-2}$ | 12.3 |

As shown in Table 1, by performing heat treatment on the oxynitride film containing indium, gallium, and zinc deposited in an atmosphere containing nitrogen so that hydrogen atoms are diffused into the oxynitride film, the electric conductivity is increased and the conductive oxynitride film can be formed.

The electric conductivity of an oxynitride film containing indium, gallium, and zinc, which contains hydrogen atoms depends on the nitrogen concentration in a deposition atmosphere. FIG. 1 shows results obtained by plotting electric conductivities with respect to nitrogen gas concentrations in a deposition atmosphere. According to the graph of FIG. 1, it can be understood that by adding nitrogen to the deposition atmosphere, the electric conductivity can be drastically increased and by increasing the concentration of nitrogen added to the deposition atmosphere, the electric conductivity can be gradually reduced.

Next, conductive oxynitride films are measured by an X-ray diffraction (XRD) method. Samples deposited under the conditions shown in Table 1 and subjected to no heat treatment or heat treatment at 350° C. or 700° C. after the deposition are measured. Note that the thickness of the samples is 400 nm.

Figure 2A:
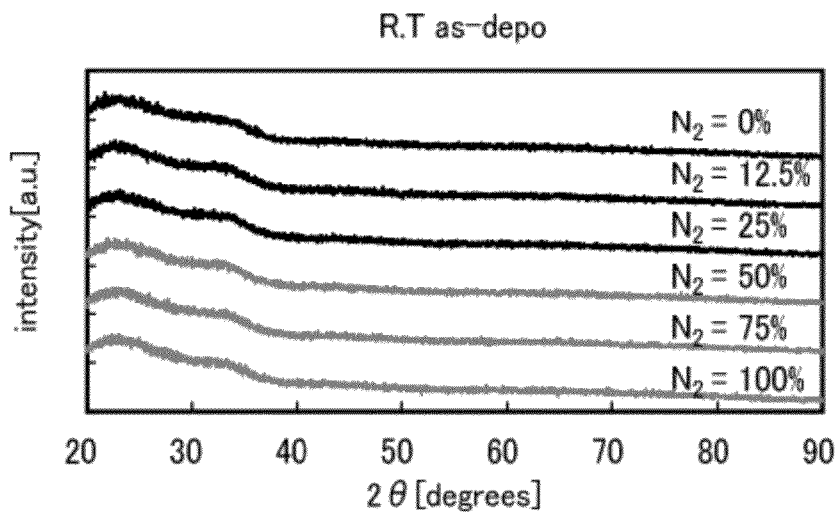
FIGS. 2A to 2C each show results obtained by measuring films each containing indium, gallium, and zinc by XRD.
Figure 2B:
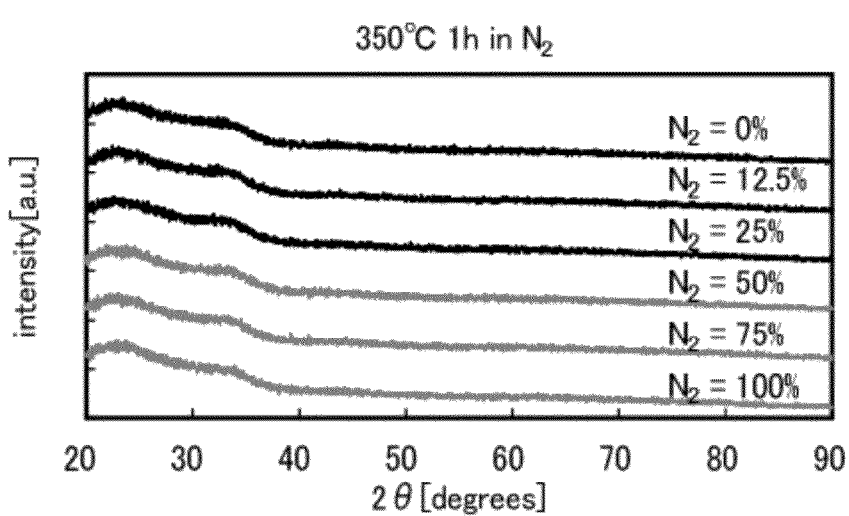
Figure 2C:
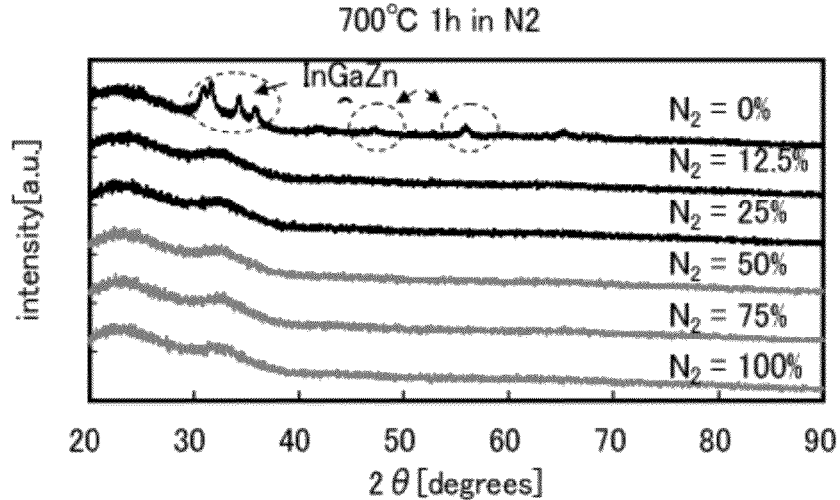

FIGS. 2A to 2C show X-ray diffraction graphs of samples under different heat treatment conditions. Note that a given unit of diffraction intensity is used on a vertical axis. Further, to compare the diffraction graph lines of the samples easily, the graph lines are arranged at regular intervals.

First, FIG. 2A shows the X-ray diffraction graph of the samples which are not subjected to heat treatment after deposition. A given unit of diffraction intensity is used on the vertical axis of the graph. Further, the concentrations of a nitrogen gas added to the deposition atmosphere are shown as well as the diffraction graph lines of the samples. Since a characteristic diffraction peak is not seen in any of the diffraction graph lines of the samples shown in FIG. 2A, it is understood that the samples each have an amorphous structure.

Next, FIG. 2B shows the X-ray diffraction graph of the samples subjected to heat treatment at 350° C. for an hour. Since a characteristic diffraction peak is not seen in any of the diffraction lines of the samples shown in FIG. 2B, it is understood that the samples each have an amorphous structure regardless of the deposition atmosphere.

Further, FIG. 2C shows the X-ray diffraction graph of the samples subjected to heat treatment at 700° C. for an hour. Diffraction signs derived from $InGaZnO_4$ are seen due to heat treatment only in the case of the sample formed in an atmosphere which does not contain nitrogen among the samples subjected to heat treatment. On the other hand, a characteristic diffraction peak is not seen in the case of the sample formed in atmospheres containing nitrogen. According to this result, it is understood that the samples formed in atmospheres containing nitrogen each have an amorphous structure.

FIGS. 3A and 3B, 4A and 4B, and 5A and 5B show measurement results of secondary ion mass spectrometry (SIMS) before and after heat treatment of oxynitride films each containing indium, gallium, and zinc. Note that the oxynitride films each containing indium, gallium, and zinc are deposited in atmospheres of three different nitrogen concentrations (no nitrogen, nitrogen of 12.5%, and nitrogen of 100%). Further, heat treatment is performed in a nitrogen atmosphere at 350° C. for an hour. Note that the thickness of the samples is 100 nm.

The horizontal axes of the graphs of FIGS. 3A and 3B, 4A and 4B, and 5A and 5B represent the depth from a surface of the oxynitride film containing indium, gallium, and zinc. The depth of the surface is defined as 0 nm and the depth is positive in a direction toward the substrate. Meanwhile, on the vertical axes of the graphs, atomic percentages of oxygen, gallium, indium, and zinc are plotted and secondary ion intensities of argon (Ar), nitrogen (N), and hydrogen (H) are plotted.

Figure 3A:
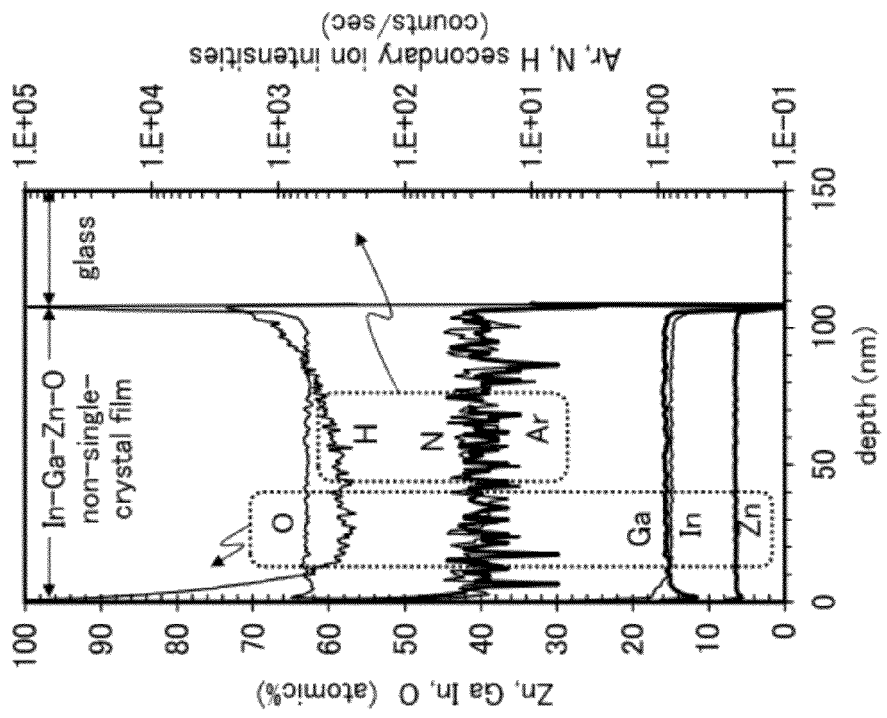
FIGS. 3A and 3B each show a result obtained by measuring a film containing indium, gallium, and zinc by secondary ion mass spectrometry.
Figure 3B:
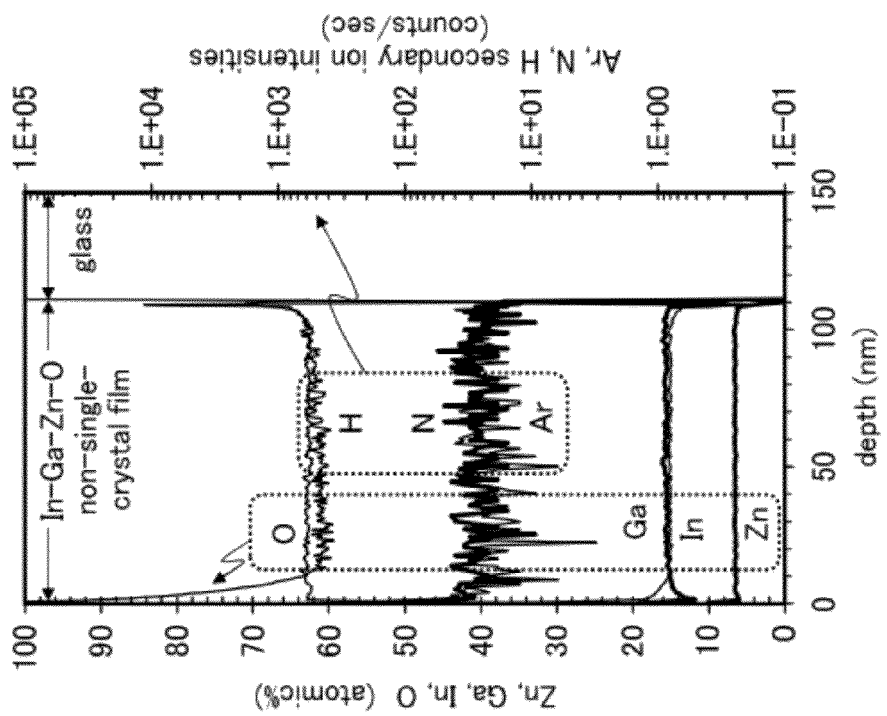
Figure 11A:
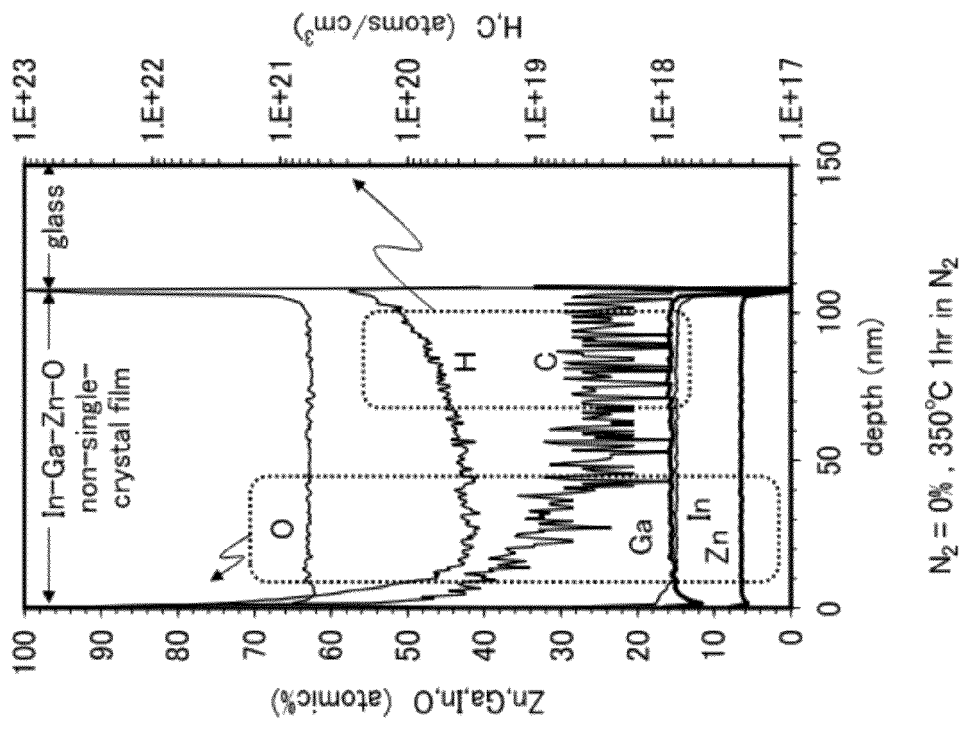
FIGS. 11A and 11B each show a result obtained by analyzing a film containing indium, gallium, and zinc by secondary ion mass spectrometry.
Figure 11B:
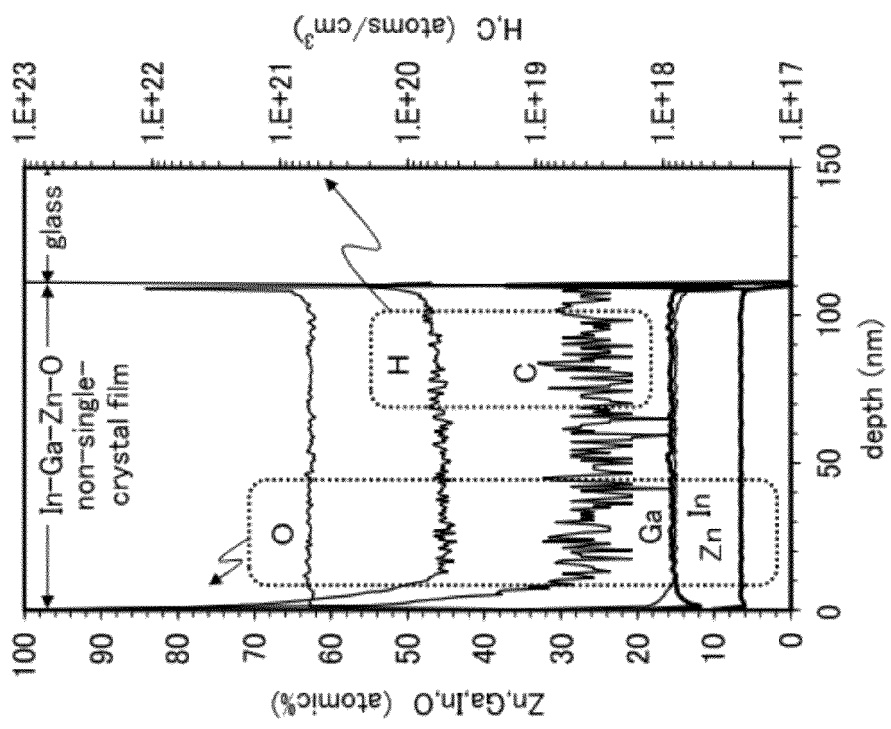
Figure 12A:
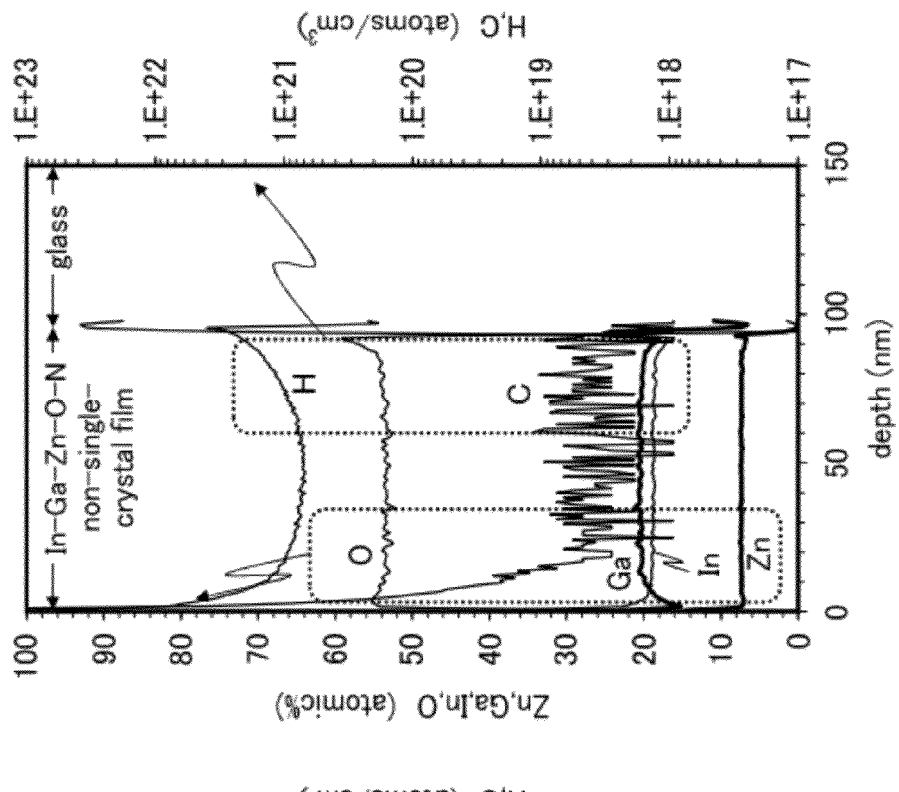
FIGS. 12A and 12B each show a result obtained by analyzing a film containing indium, gallium, and zinc by secondary ion mass spectrometry.
Figure 12B:
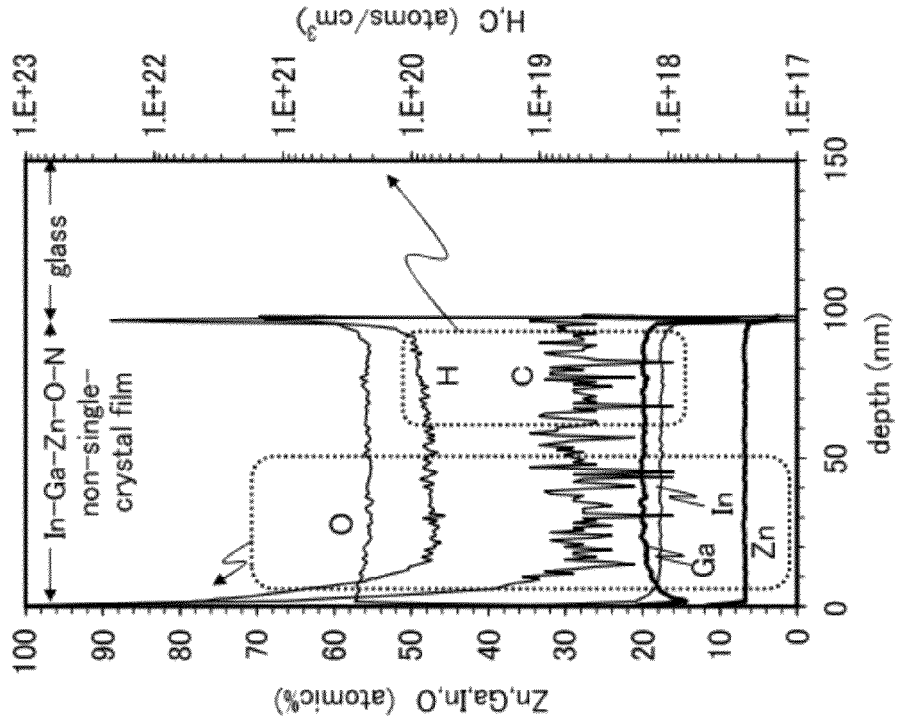
Figure 13A:
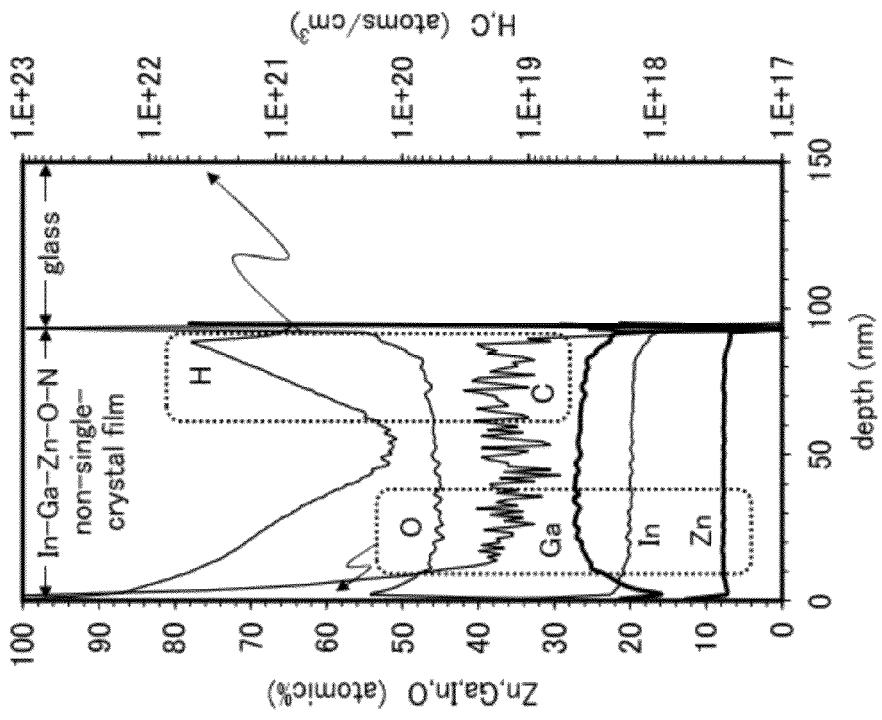
FIGS. 13A and 13B each show a result obtained by analyzing a film containing indium, gallium, and zinc by secondary ion mass spectrometry.
Figure 13B:
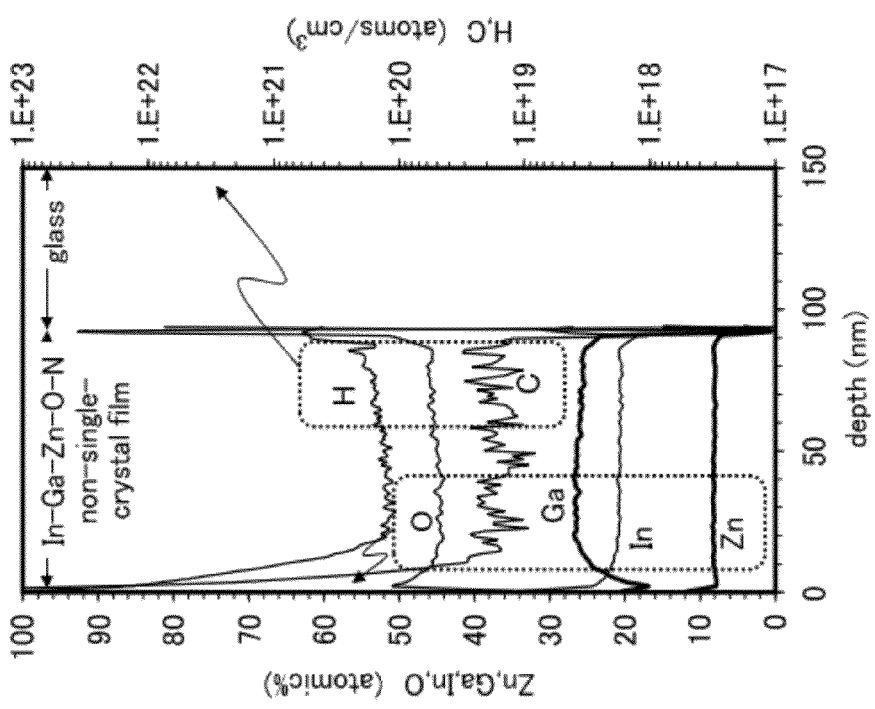

Note that FIGS. 11A and 11B show results obtained by converting the secondary ion intensities of hydrogen atoms plotted in FIGS. 3A and 3B to concentrations. FIGS. 12A and 12B show results obtained by converting the secondary ion intensities of hydrogen atoms plotted in FIGS. 4A and 4B to concentrations. FIGS. 13A and 13B show results obtained by converting the secondary ion intensities of hydrogen atoms plotted in FIGS. 5A and 5B to concentrations.

As comparative examples, FIGS. 3A and 3B show results of secondary ion mass spectrometry of the oxide films each containing indium, gallium, and zinc deposited in an atmosphere which does not contain nitrogen. FIG. 3A shows the result of secondary ion mass spectrometry of the oxide film which is not subjected to heat treatment. FIG. 3B shows the result of secondary ion mass spectrometry of the oxide film subjected to heat treatment. According to the results, in regions deeper than or equal to 20 nm from the surface, hydrogen atoms of $10^2$ to $10^3$ counts/sec are observed regardless of whether heat treatment is performed. Therefore, a change in composition due to heat treatment is small. Note that according to FIGS. 11A and 11B, it is understood that hydrogen atoms of about $10^{20}$ atoms/cm$^3$ exist in the oxide films each containing indium, gallium, and zinc.

Figure 4A:
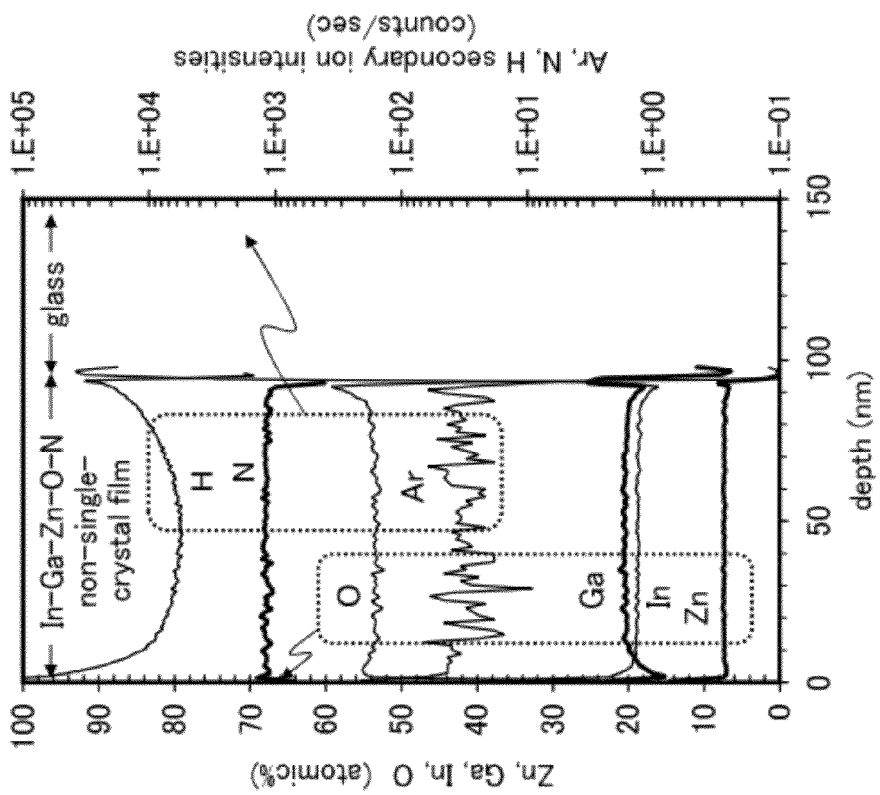
FIGS. 4A and 4B each show a result obtained by measuring a film containing indium, gallium, and zinc by secondary ion mass spectrometry.
Figure 4B:
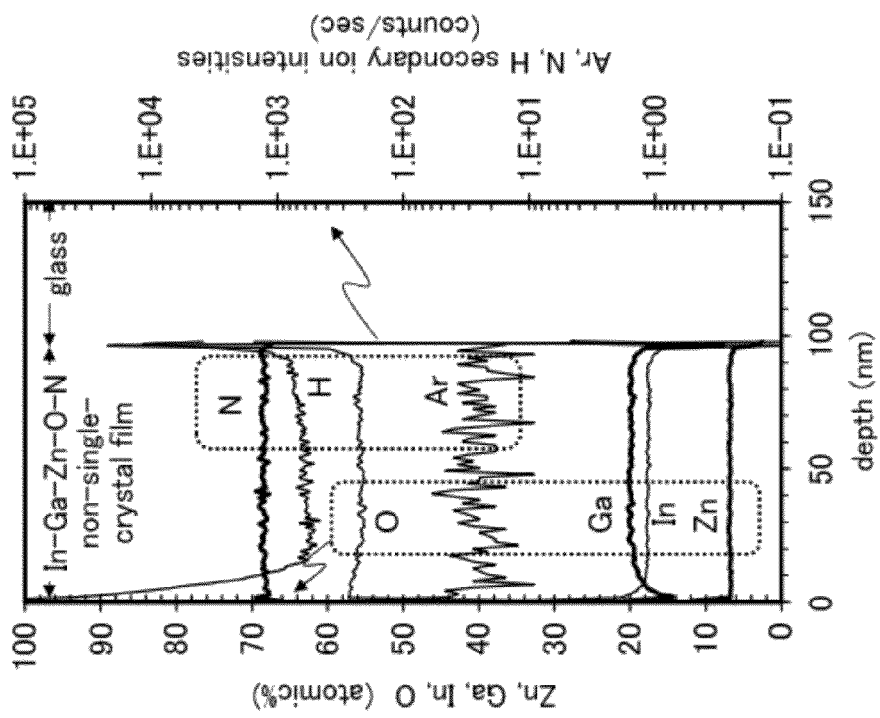

FIGS. 4A and 4B show results of secondary ion mass spectrometry of the oxynitride films each containing indium, gallium, and zinc deposited in an atmosphere containing nitrogen of 12.5%. FIG. 4A shows the result of secondary ion mass spectrometry of the oxynitride film which is not subjected to heat treatment. FIG. 4B shows the result of secondary ion mass spectrometry of the oxynitride film subjected to heat treatment. According to the results, in regions deeper than or equal to 20 nm from the surface, hydrogen atoms of $10^2$ to $10^3$ counts/sec are observed in the sample which is not subjected to heat treatment. On the other hand, hydrogen atoms of $10^3$ to $10^4$ counts/sec are observed in the sample subjected to heat treatment. Note that according to FIG. 12B, it is understood that hydrogen atoms of about $10^{21}$ atoms/cm$^3$ exist in the oxynitride film containing indium, gallium, and zinc after heat treatment.

Figure 5A:
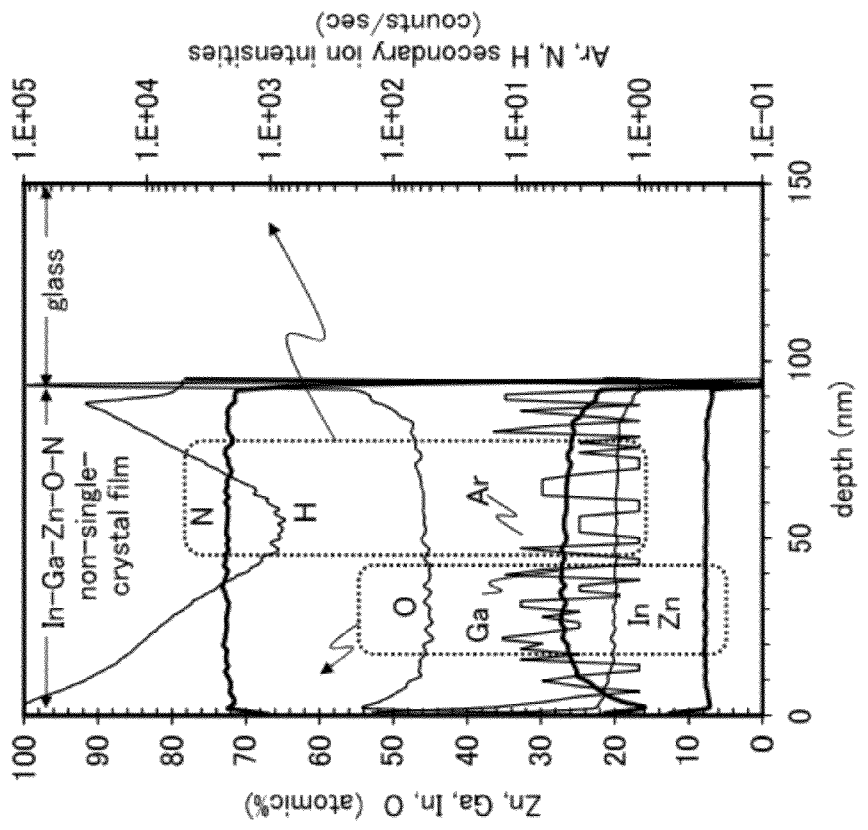
FIGS. 5A and 5B each show a result obtained by measuring a film containing indium, gallium, and zinc by secondary ion mass spectrometry.
Figure 5B:
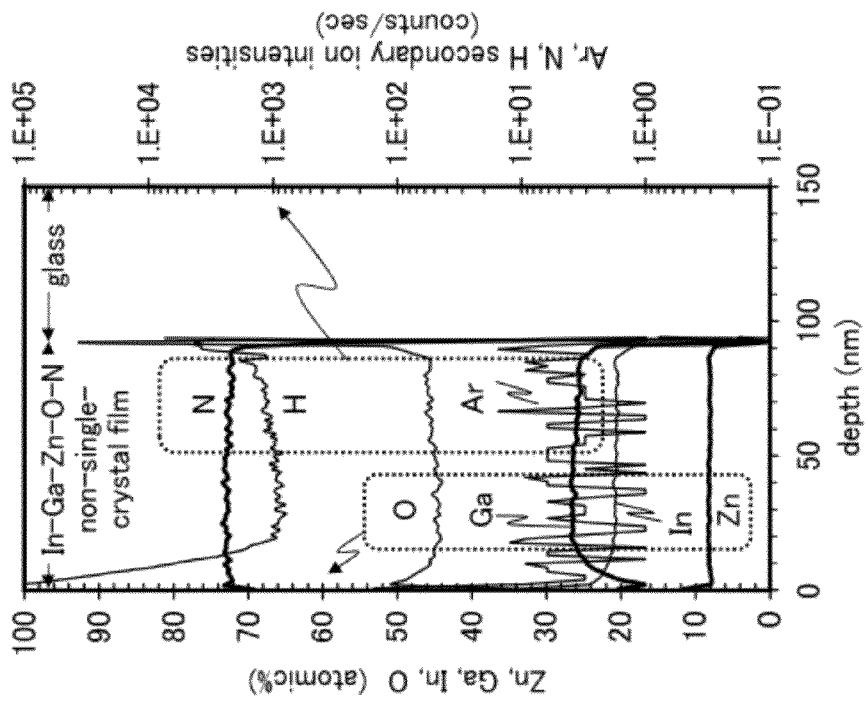

FIGS. 5A and 5B show results of secondary ion mass spectrometry of the oxynitride films each containing indium, gallium, and zinc deposited in an atmosphere containing only nitrogen. According to the results, in regions deeper than or equal to 20 nm from the surface, hydrogen atoms of $10^2$ to $10^3$ counts/sec are observed in the sample which is not subjected to heat treatment. On the other hand, hydrogen atoms of $10^3$ to $10^4$ counts/sec are observed in the sample subjected to heat treatment. Note that according to FIG. 13B, it is understood that hydrogen atoms of about $10^{20}$ to $10^{21}$ atoms cm$^3$ exist in the oxynitride film containing indium, gallium, and zinc after heat treatment.

Note that hydrogen atoms are observed not only on the surface of the oxynitride film containing indium, gallium, and zinc but also in the vicinity of the interface between the oxynitride film and non-alkali glass with high frequency. This indicates that hydrogen atoms are diffused into the oxynitride film containing indium, gallium, and zinc from not only the surface of the oxynitride film, which is exposed to the air, but also the interface in contact with the glass substrate.

Figure 6:
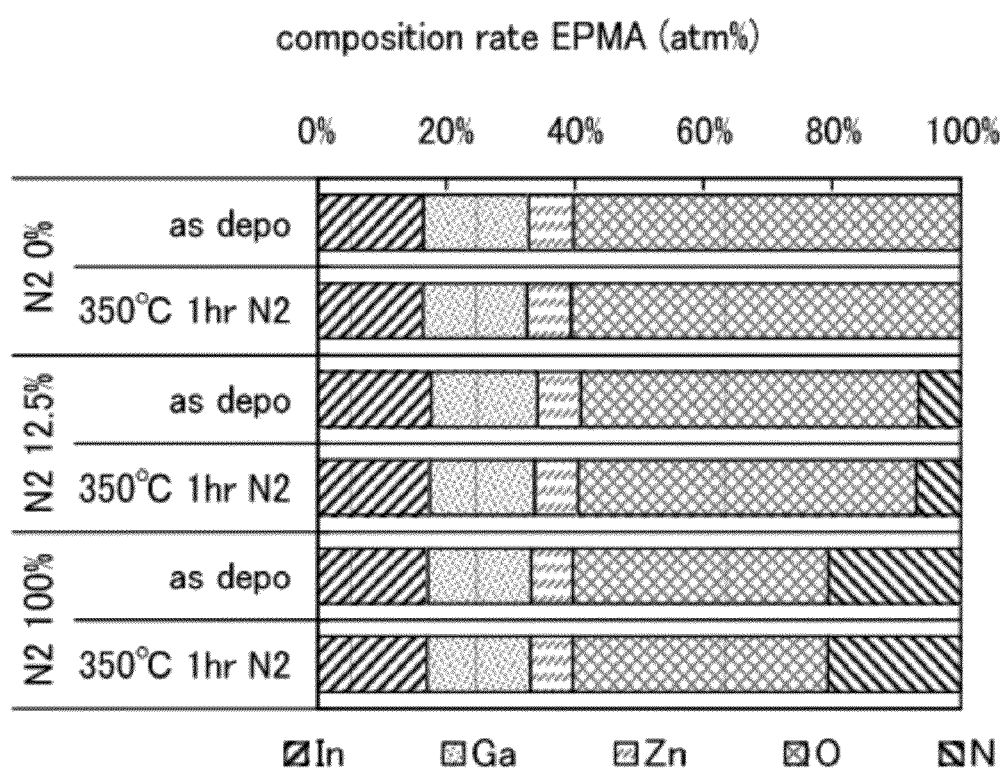
FIG. 6 shows results obtained by analyzing films each containing indium, gallium, and zinc by an electron probe X-ray microanalyzer.

Next, FIG. 6 shows results obtained by analyzing oxynitride films each containing indium, gallium, and zinc deposited in atmospheres of different nitrogen concentrations by an electron probe X-ray microanalyzer (EPMA). Specifically, three samples deposited in an atmosphere which does not contain nitrogen, an atmosphere containing nitrogen of 12.5% by volume, and an atmosphere containing nitrogen of 100% by volume, respectively, and each is subjected to no heat treatment or heat treatment in a nitrogen atmosphere at 350° C. for an hour, so that six samples are manufactured in total, and the samples are analyzed by the electron probe X-ray microanalyzer. Note that the thickness of the samples is 1 μm.

In terms of whether heat treatment is performed, a change in composition due to heat treatment is not seen as long as analyses are performed by the electron probe X-ray microanalyzer. On the other hand, in terms of the nitrogen concentrations in deposition atmospheres, the composition rate of oxygen is reduced and the composition rate of nitrogen is increased as the nitrogen concentration is increased. However, there is substantially no change in composition ratio of indium, gallium, and zinc which are metal elements.

EXAMPLE 2

This example will describe a conductive oxynitride film manufactured by a method similar to that of Embodiment 1. Specifically, the relation between heat treatment temperatures and characteristics will be described.

In this example, a 0.7 mm-thick non-alkali glass substrate (EAGLE2000 manufactured by Corning, Inc.) is used as a substrate. Further, a film containing indium, gallium, and zinc is formed over the substrate by a sputtering method using a target of 12 inch in diameter obtained by sintering indium oxide, gallium oxide, and zinc oxide ($In_2O_3$:$Ga_2O_3$:ZnO=1:1:1), and setting the distance between the substrate and the target to be 60 mm. The deposition is performed in different atmospheres obtained by changing mixture ratio of argon and nitrogen which are introduced in a deposition chamber, by a sputtering method under the condition that the pressure is 0.4 Pa and the DC power is 0.5 kW.

Note that three different samples are manufactured in atmospheres containing only an argon gas ($N_2$/(Ar+$N_2$)=0%), nitrogen of 12.5% ($N_2$/(Ar+$N_2$)=12.5%), and nitrogen of 100% ($N_2$/(Ar+$N_2$)=100%) as specific mixture ratios of an argon gas and nitrogen, respectively.

First, crystallization phenomena accompanied by heating will be described. A light-transmitting conductive film according to an embodiment of the present invention can be prevented from being crystallized by adjusting the concentration of nitrogen added to a gas used for sputtering. Specific description is given below.

After substrates over each of which a film containing indium, gallium, and zinc is deposited are carried out of a deposition chamber and exposed to the air, heat treatment is performed at different temperatures in a nitrogen atmosphere for an hour. Note that this example will describe results obtained by performing heat treatment at five different temperatures of 350° C., 700° C., 800° C., 900° C., and 1000° C. as examples.

The crystallization phenomena of the samples are observed by an X-ray diffraction (XRD) method. Note that the thickness of the samples is 400 nm.

Figure 14A:
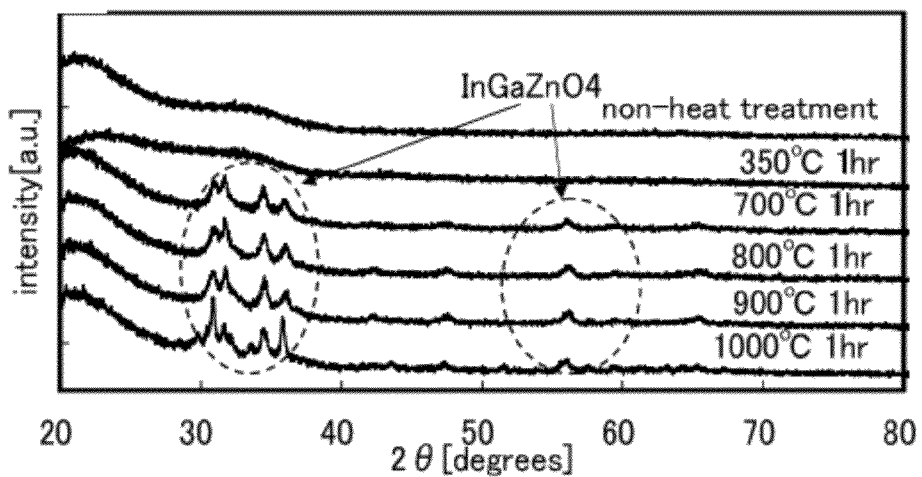
FIGS. 14A to 14C each show results obtained by measuring films each containing indium, gallium, and zinc by XRD.
Figure 14B:
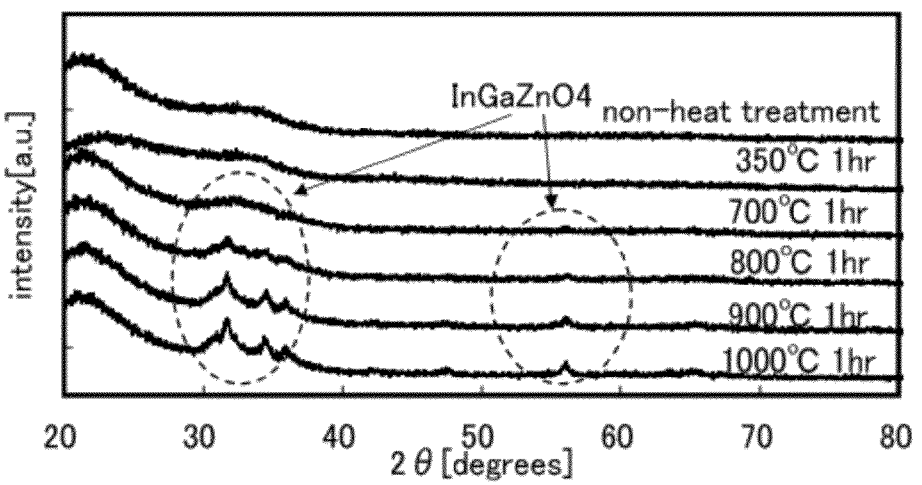
Figure 14C:
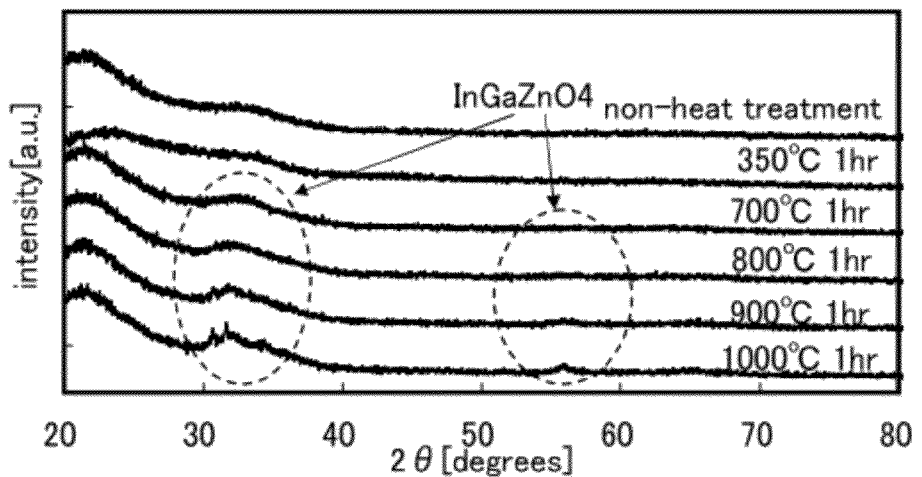

FIGS. 14A to 14C show X-ray diffraction graphs of samples under different deposition conditions. FIG. 14A shows results obtained by measuring the samples manufactured using only an argon gas as a sputtering gas, FIG. 14B shows results obtained by measuring the samples manufactured using a gas containing nitrogen of 12.5% as a sputtering gas, and FIG. 14C shows results obtained by measuring the samples manufactured using only nitrogen as a sputtering gas. Note that a given unit of diffraction intensity is used on vertical axes of the graphs. Further, to compare the diffraction lines of the samples easily, the lines are arranged at regular intervals.

The sample manufactured using only an argon gas has a sharp diffraction peak due to heat treatment at over 700° C. (see FIG. 14A). The sample manufactured using a gas containing nitrogen of 12.5% also has a diffraction peak due to heat treatment at over 700° C. (see FIG. 14B). However, the sample manufactured using a gas containing nitrogen of 12.5% has a slower diffraction peak than the sample manufactured using only an argon gas. Further, the sample manufactured using only nitrogen has weak diffraction signs even if heat treatment at over 700° C. is performed (see FIG. 14C).

Since such diffraction signs are derived from crystallization, it is understood that the film containing indium, gallium, and zinc can be prevented from being crystallized in the case where nitrogen is added to a gas used for sputtering. Thus, a conductive film transmitting visible light according to an embodiment of the present invention, which is deposited using a gas to which nitrogen is added, is not likely to be crystallized even if subjected to heat treatment.

Next, a change in electric conductivity accompanied by heat treatment will be described. The electric conductivity of a light-transmitting conductive film according to an embodiment of the present invention can be increased by heat treatment. Specific description is given below.

Here, after substrates over each of which a film containing indium, gallium, and zinc is deposited by a sputtering method using a gas containing nitrogen of 12.5% are carried out of a deposition chamber and exposed to the air, heat treatment is performed at different temperatures in a nitrogen atmosphere for an hour. Note that here, heat treatment is performed at six different temperatures of 200° C., 250° C., 300° C., 320° C., 350° C., and 450° C.

Figure 15A:
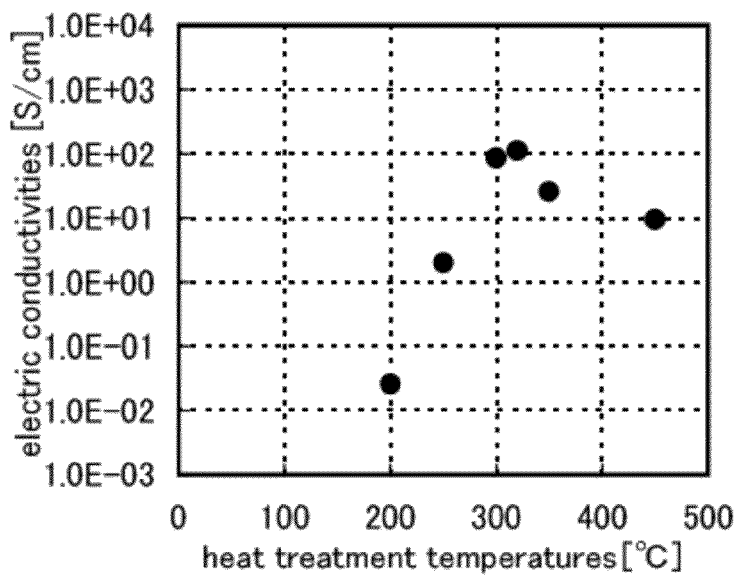
FIGS. 15A and 15B show heat treatment temperatures, electric conductivities, mobilities, and carrier concentrations of films each containing indium, gallium, and zinc.
Figure 15B:
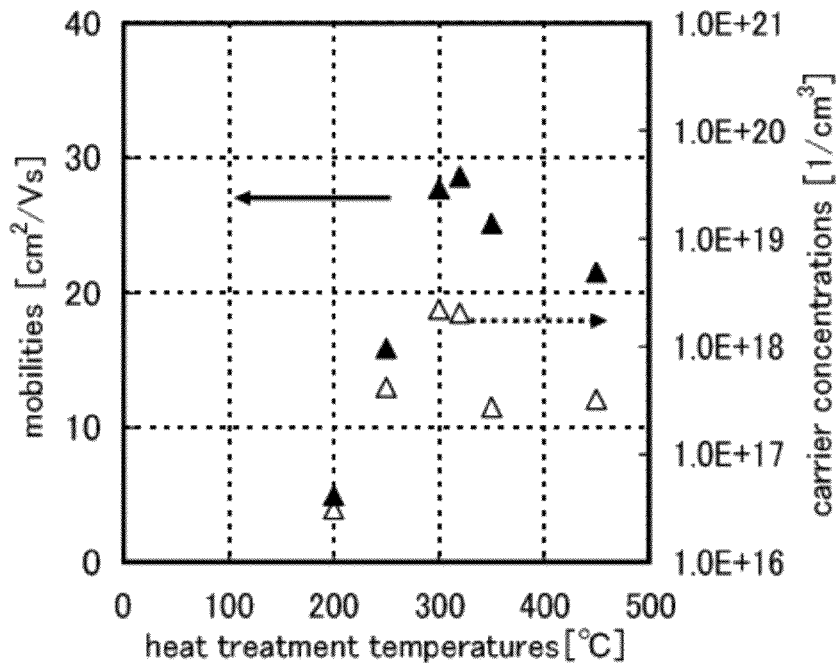

The electric conductivities, the mobilities, and the carrier concentrations of the samples are measured using a Hall Effect measurement instrument. FIGS. 15A and 15B show the results. Note that the thickness of the samples is 50 nm.

The electric conductivity of a light-transmitting conductive film according to an embodiment of the present invention is changed depending on a heating temperature (see FIG. 15A). In particular, by performing heat treatment at temperatures of about 300° C. to 350° C., a conductive film having high electric conductivity can be provided. Note that both the mobility and the carrier concentration of the conductive film are particularly high in the case where heat treatment is performed at temperatures of about 300° C. to 350° C. (see FIG. 15B).

Next, a change in composition accompanied by heat treatment will be described. As for a light-transmitting conductive film according to an embodiment of the present invention, the amount of hydrogen atoms diffused into the conductive film can be increased by heat treatment. Specific description is given below.

Here, after oxynitride films containing indium, gallium, and zinc are deposited over substrates by a sputtering method using a gas containing nitrogen of 12.5% and the substrates are carried out of a deposition chamber and exposed to the air, heat treatment is performed at different temperatures in a nitrogen atmosphere for an hour. Note that here, the samples subjected to heat treatment at three different temperatures of 250° C., 300° C., and 450° C. are compared.

Figure 16A:
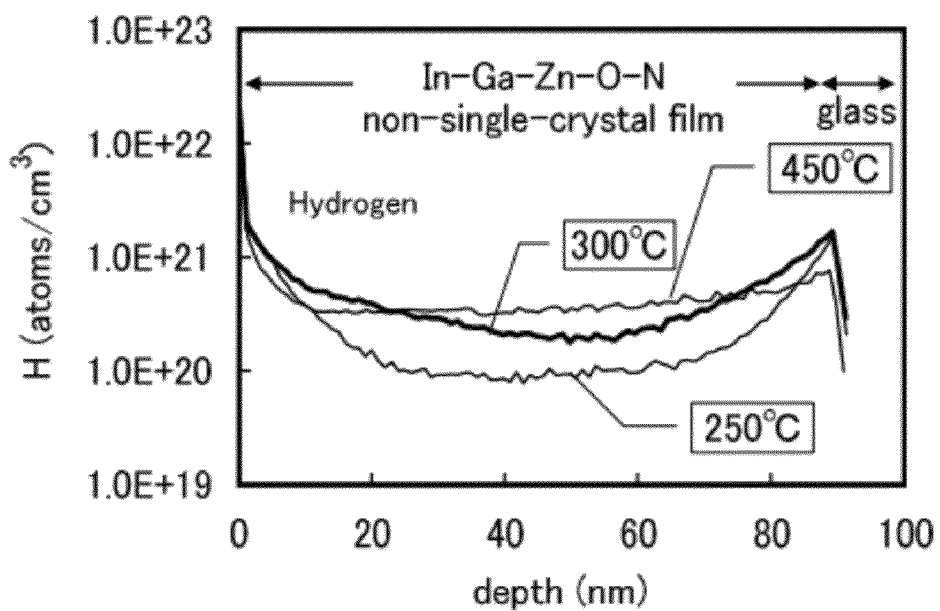
FIGS. 16A and 16B each show results obtained by analyzing a film containing indium, gallium, and zinc by secondary ion mass spectrometry.
Figure 16B:
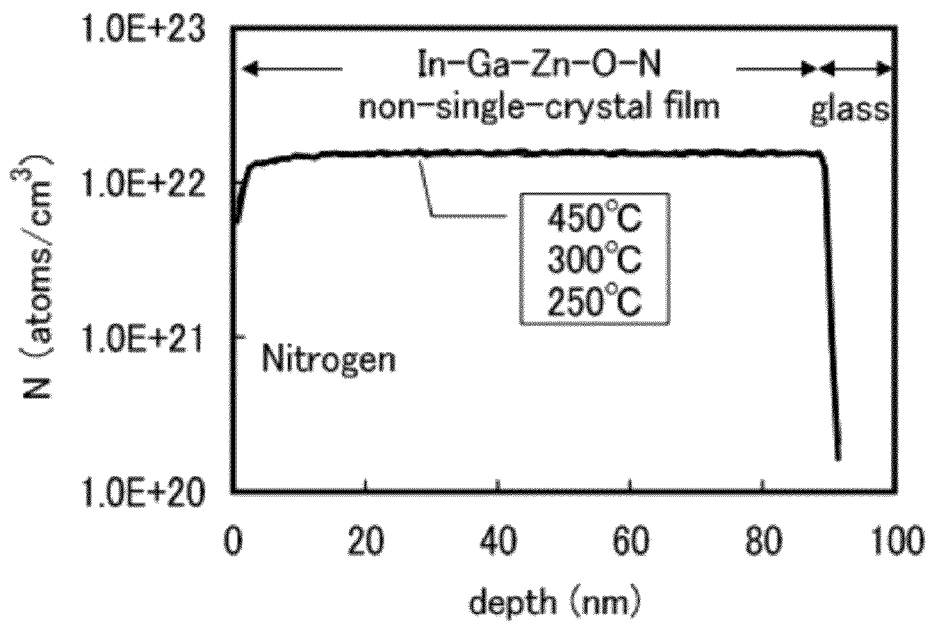

FIGS. 16A and 16B show measurement results by secondary ion mass spectrometry (SIMS) focusing on hydrogen atoms and nitrogen atoms. Note that the thickness of the samples is about 100 nm.

The amount of hydrogen contained in a light-transmitting conductive film according to an embodiment of the present invention is changed depending on a heating temperature (see FIG. 16A). In terms of the concentration of hydrogen atoms contained in part in the range of about 50 nm in depth from a surface of the conductive film, the sample subjected to heat treatment at 300° C. has higher concentration of hydrogen atoms than the sample subjected to heat treatment at 250° C., and the sample subjected to heat treatment at 450° C. has higher concentration of hydrogen atoms than the sample subjected to heat treatment at 300° C. These results show that heat treatment facilitates diffusion of hydrogen atoms in the conductive film.

On the other hand, a certain distribution of nitrogen atoms in the conductive film is maintained even if a heat treatment temperature is changed. Thus, a phenomenon in which heat treatment facilitates diffusion is not seen (see FIG. 16B).

EXAMPLE 3

This example will describe a conductive oxynitride film manufactured by a method similar to that of Embodiment 1. Specifically, the relation between the compositions of gases introduced into a deposition chamber at the time of deposition by a sputtering method and characteristics will be described.

In this example, a 0.7 mm-thick non-alkali glass substrate (EAGLE2000 manufactured by Corning, Inc.) is used as a substrate. Further, an oxynitride film containing indium, gallium, and zinc is deposited over the substrate by a sputtering method using a target of 12 inch in diameter obtained by sintering indium oxide, gallium oxide, and zinc oxide ($In_2O_3$: $Ga_2O_3$:ZnO=1:1:1), and setting the distance between the substrate and the target to be 60 mm. The deposition is performed in different atmospheres obtained by changing mixture ratio of an argon gas and nitrogen by a sputtering method under the condition that the pressure is 0.4 Pa and the DC power is 0.5 kW.

First, effects on electric conductivities by the compositions of gases introduced into a deposition chamber at the time of deposition will be described. The electric conductivity of the light-transmitting conductive film according to an embodiment of the present invention can be controlled by adjusting the amount of nitrogen added to a gas used for sputtering. Specific description is given below.

Figure 17:
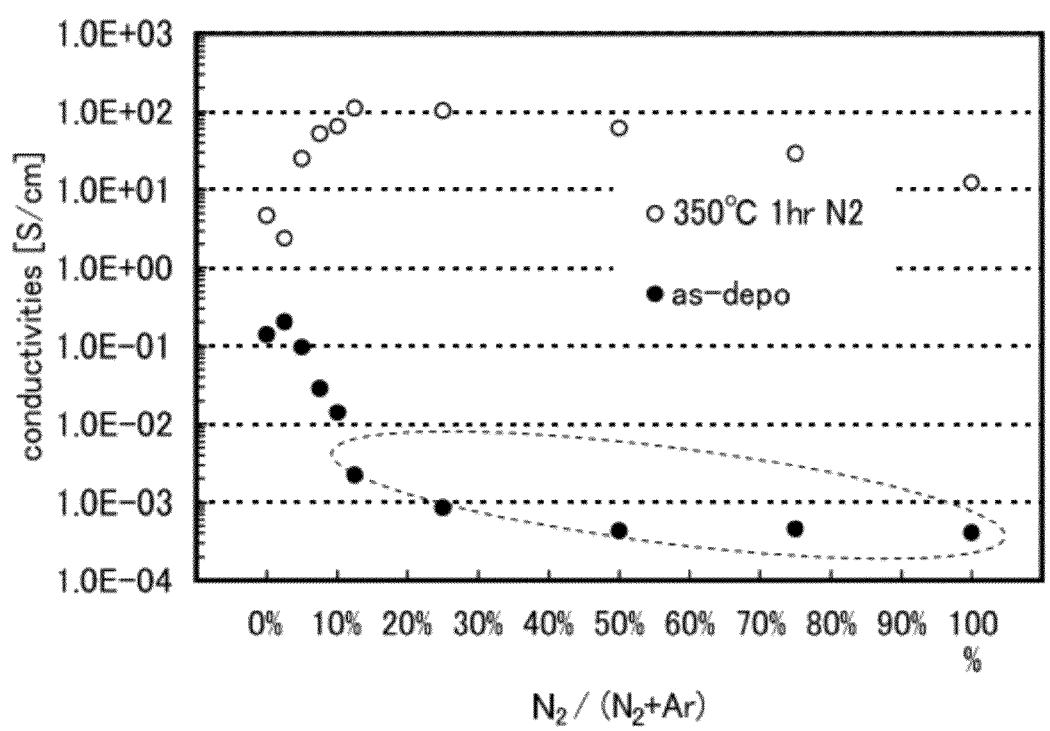
FIG. 17 shows deposition atmospheres and electric conductivities of films each containing indium, gallium, and zinc.

Samples are manufactured in ten different atmospheres by changing the mixture ratio of an argon gas and nitrogen. FIG. 17 shows measurement results of electric conductivities. Note that the thickness of the samples is 50 nm.

In FIG. 17, the electric conductivities of the films containing indium, gallium, and zinc obtained under the deposition conditions shown in FIG. 17 which are not subjected to heat treatment are plotted by black dots with respect to the concentrations of nitrogen contained in a deposition gas introduced into a deposition chamber at the time of deposition, and the electric conductivities of the films containing indium, gallium, and zinc obtained under the deposition conditions shown in FIG. 17 which are subjected to heat treatment at 350° C. for an hour are plotted by white dots with respect to the concentrations of nitrogen in a deposition gas. Further, the samples having electric conductivities of less than 0.01 S/cm are measured by a two-terminal method, and the samples having electric conductivities of 0.01 S/cm or more are measured by a four-probe method.

When the concentration of nitrogen added to a gas introduced into a deposition chamber is increased, the electric conductivity of the film containing indium, gallium, and zinc which is not subjected to heat treatment is reduced. However, the electric conductivities of all the samples are increased by performing heat treatment. In particular, in the case where the film deposited with addition of nitrogen of about 12.5% ($N_2$/($Ar+N_2$)=12.5%) to an argon gas is subjected to heat treatment, a conductive film having high electric conductivity can be manufactured.

Next, effects on activation energy of carriers in the film containing indium, gallium, and zinc by the concentration of nitrogen added to a gas introduced into a deposition chamber will be described. Activation energy of carriers in a light-transmitting conductive film according to an embodiment of the present invention can be changed depending on the concentration of nitrogen added to a gas introduced into a deposition chamber. Specific description is given below.

Films containing indium, gallium, and zinc are deposited in different atmospheres in which the ratios of an argon gas and nitrogen are different, so that a plurality of different samples are manufactured. After heat treatment is performed at 350° C. in a nitrogen gas for an hour, the electric conductivities of the samples are measured at different measurement temperatures.

Note that six different samples are manufactured in atmospheres containing only an argon gas ($N_2$/($Ar+N_2$)=0%), nitrogen of 12.5% ($N_2$/($Ar+N_2$)=12.5%), nitrogen of 25% ($N_2$/($Ar+N_2$)=25%), nitrogen of 50% ($N_2$/($Ar+N_2$)=50%), nitrogen of 75% ($N_2$/($Ar+N_2$)=75%), and nitrogen of 100% ($N_2$/($Ar+N_2$)=100%) as specific mixture ratios of an argon gas and nitrogen, respectively. Further, the electric conductivities are measured at six to seven temperatures ranging from room temperature to 150° C. (about 25° C., 50° C., 70° C., 90° C., 110° C., 130° C., and 150° C.).

Figure 18A:
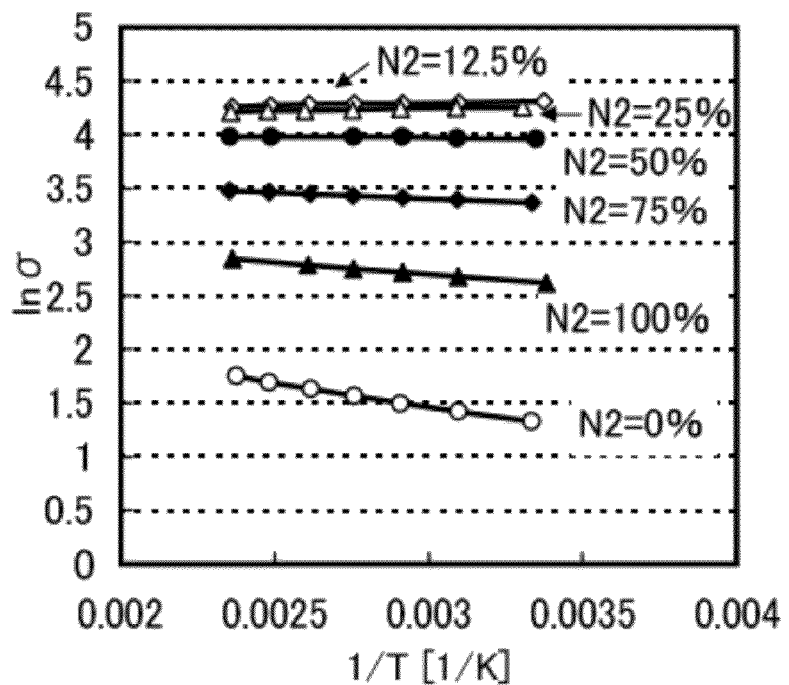
FIGS. 18A and 18B show heat treatment temperatures, electric conductivities, and activation energies of films each containing indium, gallium, and zinc.
Figure 18B:
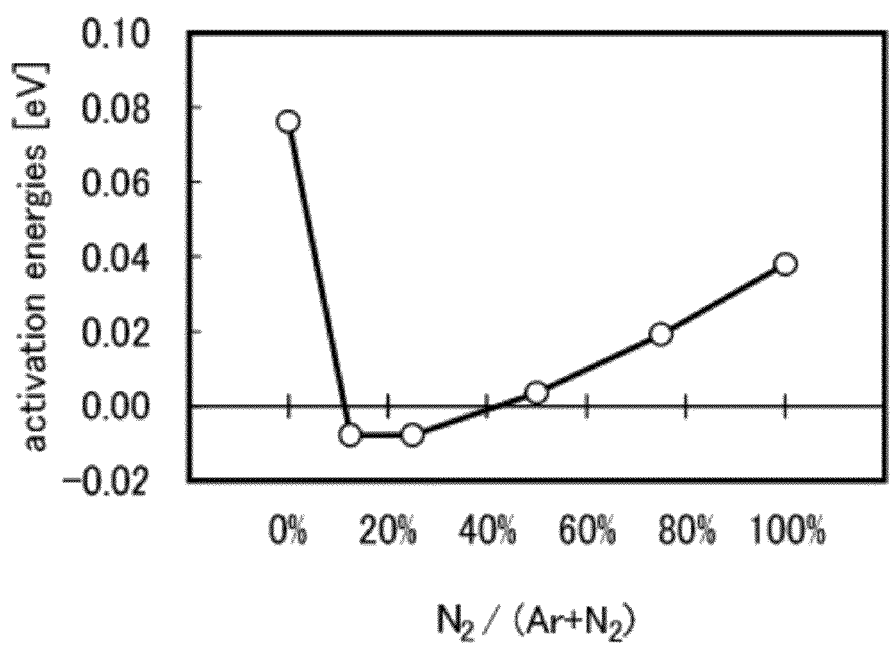

The measurement temperatures of the electric conductivities are converted to the absolute temperatures (K) and natural logarithms of the electric conductivities are plotted with respect to reciprocals of the absolute temperatures (see FIG. 18A). Then, the plotted dots of each sample are approximated to a line and activation energy is obtained from the slope. Activation energies obtained with respect to the concentrations of nitrogen added to a gas introduced into a deposition chamber are plotted (see FIG. 18B).

The activation energy of carriers in a light-transmitting conductive film according to an embodiment of the present invention can be controlled by the concentration of nitrogen added to a gas introduced into a deposition chamber. In particular, nitrogen of about 12.5% is added to a gas introduced into a deposition chamber, so that the oxynitride film containing indium, gallium, and zinc has negative activation energy of carriers and has high conductance. Note that the negative activation energy of carriers means that the oxynitride film is a degenerated semiconductor.

EXAMPLE 4

This example will describe a conductive oxynitride film manufactured by a method similar to that of Embodiment 1. Specifically, transmissivity of visible light will be described.

In this example, a 1.1 mm-thick quartz glass substrate is used as a substrate. Further, an oxynitride film containing indium, gallium, and zinc is deposited over the substrate by a sputtering method using a target of 12 inch in diameter obtained by sintering indium oxide, gallium oxide, and zinc oxide ($In_2O_3$:$Ga_2O_3$:ZnO=1:1:1), and setting the distance between the substrate and the target to be 60 mm. The deposition is performed in different atmospheres obtained by changing the mixture ratio of an argon gas and nitrogen, by a sputtering method under the condition that the pressure is 0.4 Pa and the DC power is 0.5 kW. Further, a 100 mm-thick silicon oxide film is deposited over the oxynitride film containing indium, gallium, and zinc by a sputtering method.

Note that samples are manufactured in atmospheres containing only an argon gas ($N_2$/($Ar+N_2$)=0%), and nitrogen of 12.5% ($N_2$/($Ar+N_2$)=12.5%) as specific mixture ratios of an argon gas and nitrogen, respectively. Further, the thickness of the samples is 100 nm.

Figure 19A:
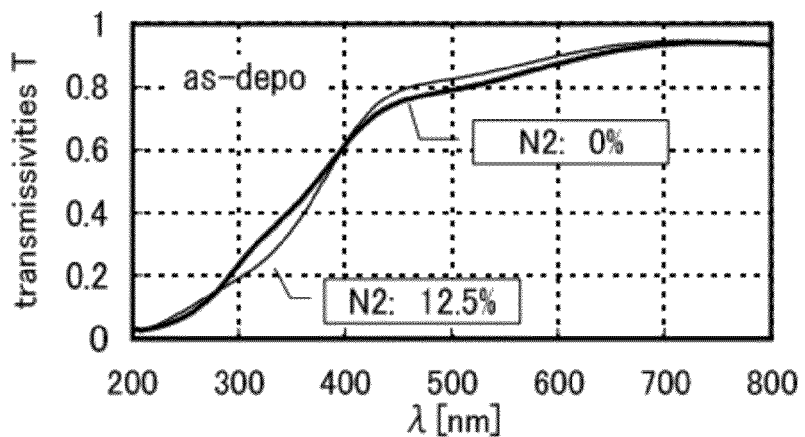
FIGS. 19A to 19C each show transmissivities of films each containing indium, gallium, and zinc.
Figure 19B:
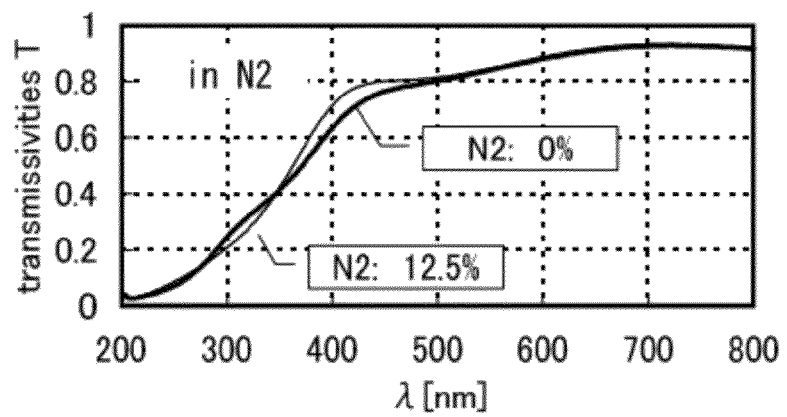
Figure 19C:
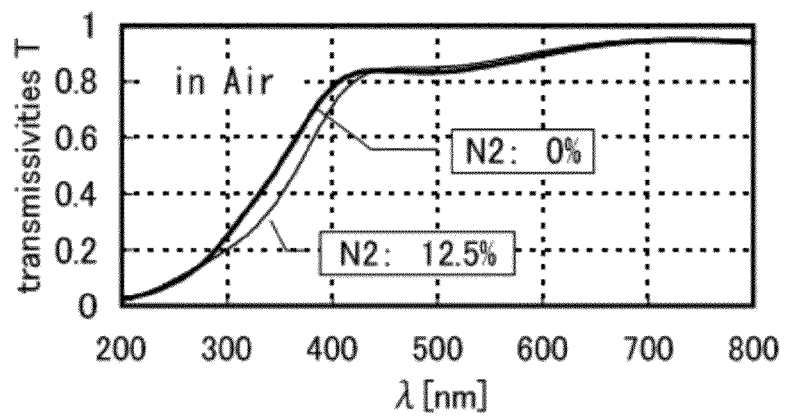

FIGS. 19A to 19C show the transmissivities of the manufactured samples. FIG. 19A shows the transmissivities of the films containing indium, gallium, and zinc which are not subjected to heat treatment after the deposition. The transmissivities of both the two samples are reduced gradually in a region of wavelengths of about 450 nm or shorter. Further, by adding nitrogen of 12.5% to a gas introduced into a deposition chamber, the transmissivity is slightly increased in a region of wavelengths of 400 nm or longer.

FIG. 19B shows the transmissivities of the films each containing indium, gallium, and zinc which are subjected to heat treatment at 350° C. in nitrogen for an hour after the deposition. The transmissivity of the sample deposited with addition of nitrogen of 12.5% is increased in a region of wavelengths of about 400 nm as compared to that of the sample deposited without addition of nitrogen to a gas introduced into a deposition chamber. Note that by performing heat treatment at 350° C. in the air for an hour on the film containing indium, gallium, and zinc which is deposited without introduction of nitrogen into a deposition chamber, the transmissivity of the sample can be increased in a region of wavelengths of 300 nm or longer (see FIG. 19C).

Figure 20:
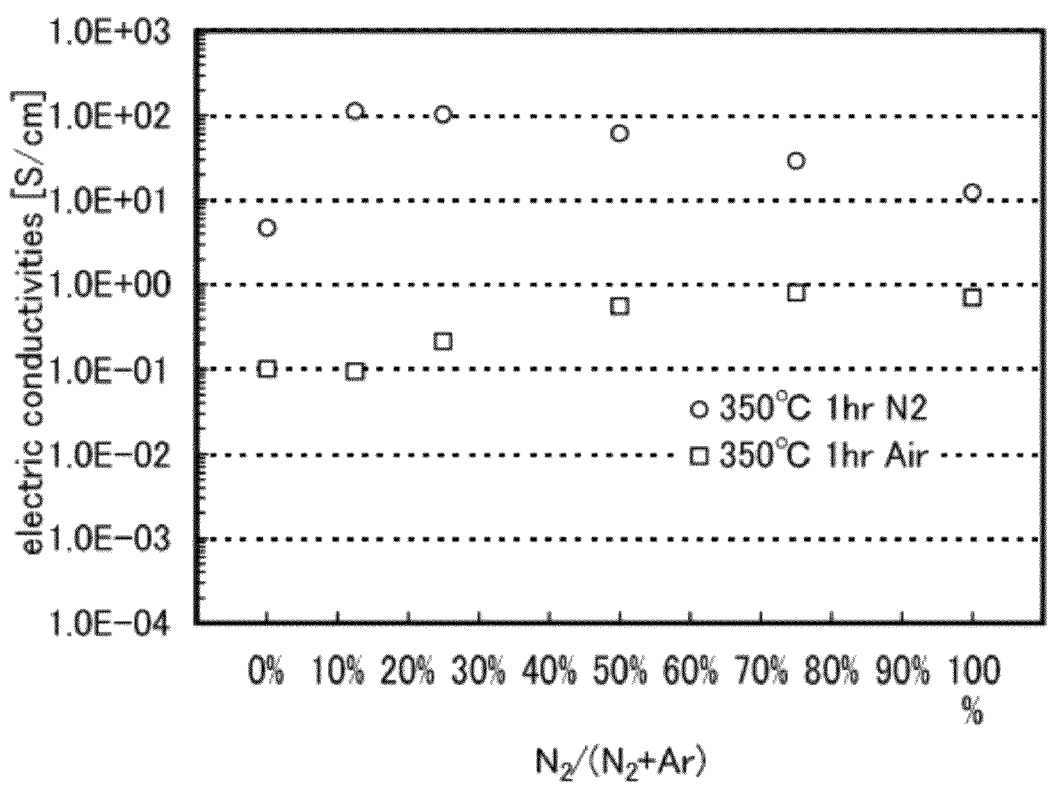
FIG. 20 shows deposition atmospheres and electric conductivities of films each containing indium, gallium, and zinc.

Note that by being subjected to heat treatment at 350° C. in nitrogen for an hour, the film containing indium, gallium, and zinc has high electric conductivity as shown in FIG. 17, and also by being subjected to heat treatment at 350° C. in the air for an hour, the film containing indium, gallium, and zinc has high electric conductivity (see FIG. 20).

EXAMPLE 5

This example will describe a conductive oxynitride film manufactured by a method similar to that of Embodiment 1. Specifically, the chemical bond of a metal element will be described.

In this embodiment, a 0.7 mm-thick non-alkali glass substrate (EAGLE2000 manufactured by Corning, Inc.) is used as a substrate. Next, an oxynitride film containing indium, gallium, and zinc is deposited over the substrate by a sputtering method using a target of 12 inch in diameter obtained by sintering indium oxide, gallium oxide, and zinc oxide ($In_2O_3$:$Ga_2O_3$:ZnO=1:1:1), and setting the distance between the substrate and the target to be 60 mm. The deposition is performed in different atmospheres obtained by changing the mixture ratio of an argon gas and nitrogen, by a sputtering method under the condition that the pressure is 0.4 Pa and the DC power is 0.5 kW.

Note that samples are manufactured in atmospheres containing only an argon gas ($N_2$/(Ar+$N_2$)=0%), nitrogen of 12.5% ($N_2$/(Ar+$N_2$)=12.5%), and nitrogen of 100% ($N_2$/(Ar+$N_2$)=100%) as specific mixture ratios of an argon gas and nitrogen, respectively. Further, the thickness of the samples is 100 nm.

In a method for manufacturing a light-transmitting conductive film, according to an embodiment of the present invention, nitrogen is added to a gas introduced into a deposition chamber and deposition is performed reacting nitrogen with indium, gallium, and zinc. This example will describe results obtained by examining the chemical bonds of indium, gallium, and zinc in the film by X-ray photoelectron spectroscopy (XPS). By the method for manufacturing a light-transmitting conductive film, according to an embodiment of the present invention, nitrogen can be bonded to indium contained in the film. Specific description is given below.

Figure 21A:
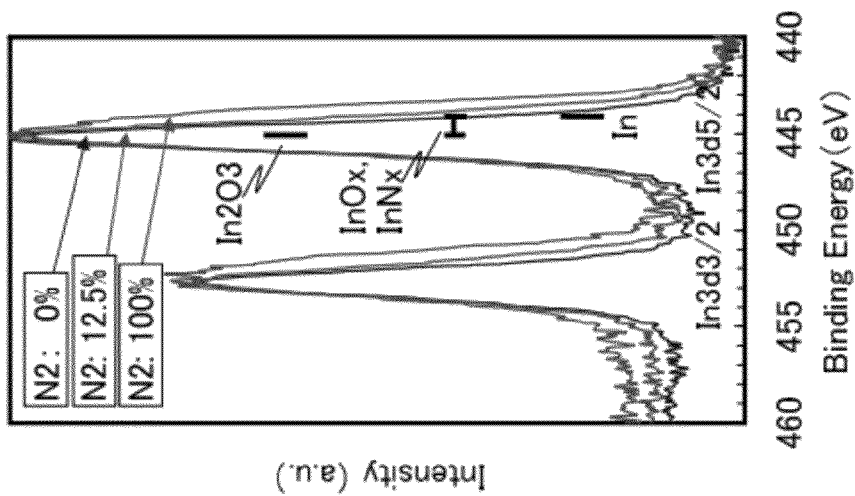
FIGS. 21A to 21C each show results obtained by measuring films each containing indium, gallium, and zinc by XPS.
Figure 21B:
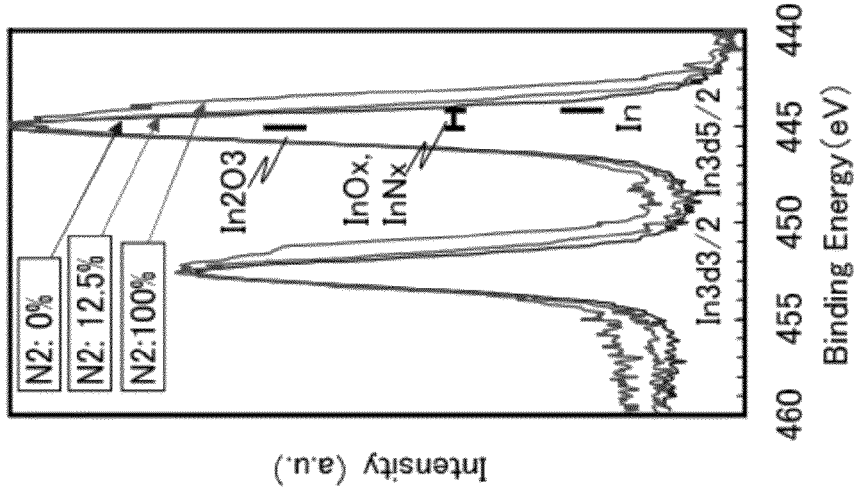
Figure 21C:
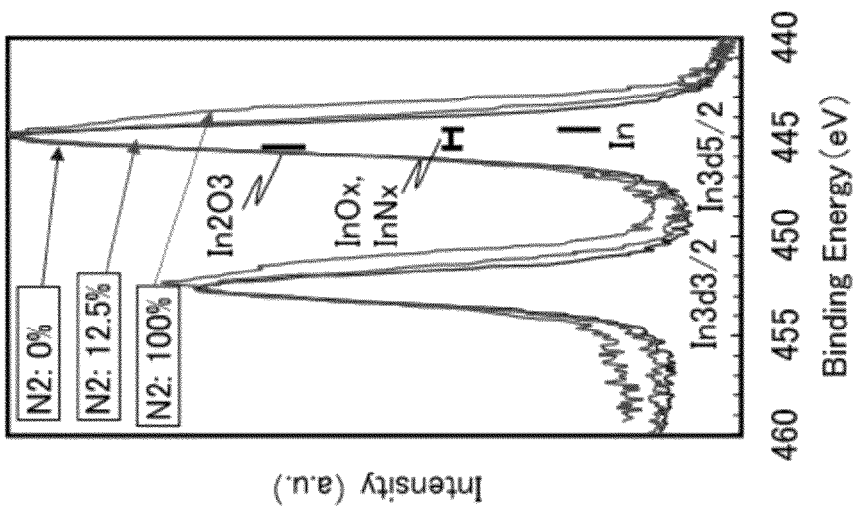

FIGS. 21A to 21C show XPS spectra focusing on the 3d orbital of indium contained in the samples. FIG. 21A shows the spectra of the samples which are not subjected to heat treatment, FIG. 21B shows the spectra of the samples subjected to heat treatment at 350° C. in nitrogen for an hour, and FIG. 21C shows the spectra of the samples subjected to heat treatment at 350° C. in the air for an hour. The main spectrum can be derived from $In_2O_3$ and the like. Further, regardless of heat treatment, when the concentration of nitrogen added to a deposition gas is increased, the spectrum width is large on the low energy side. The peak derived from InOx and InNx is on the low energy side of the main peak and further, the peak derived from In is on the energy side lower than the low energy side. Thus, the spectrum wide on the low energy side indicates that the bond of indium and nitrogen is generated.

Figure 22A:
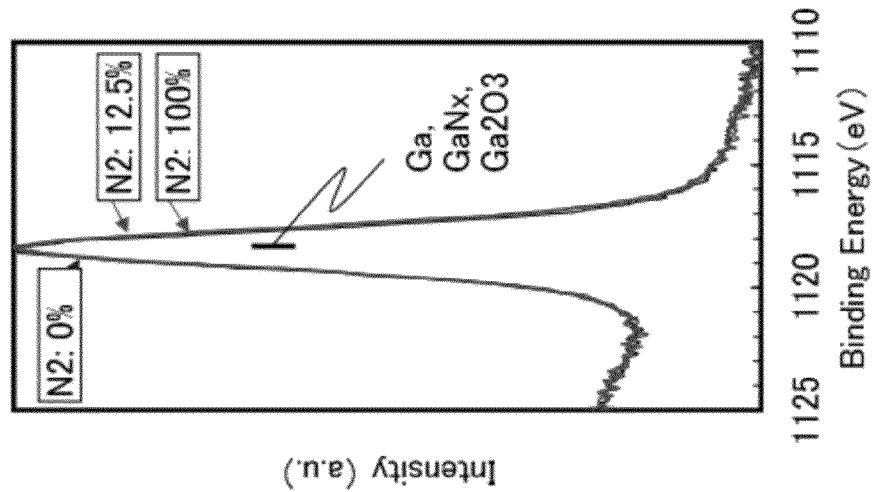
FIGS. 22A to 22C each show results obtained by measuring films each containing indium, gallium, and zinc by XPS.
Figure 22B:
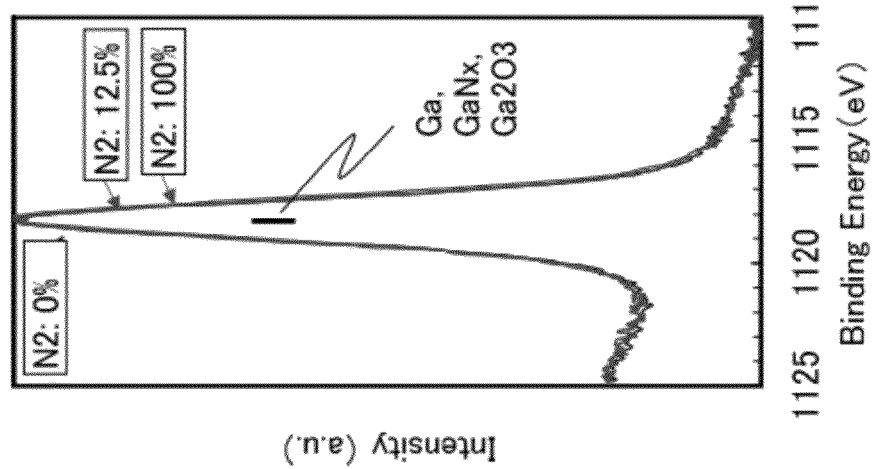
Figure 22C:
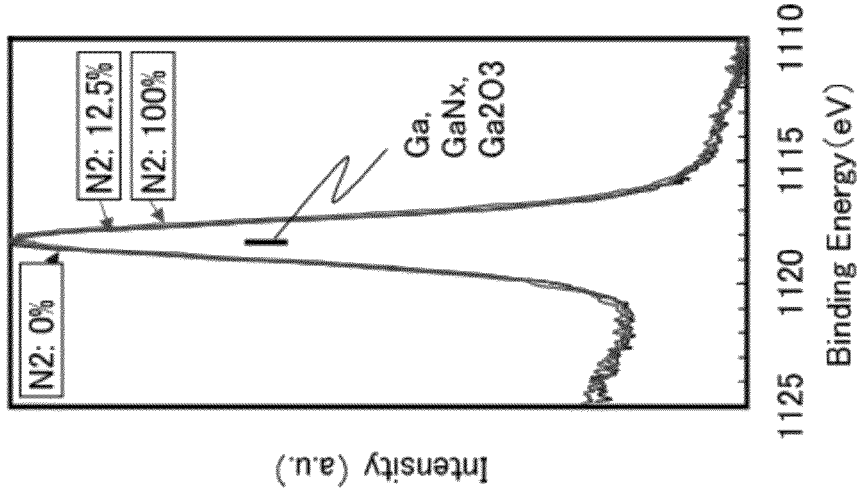

FIGS. 22A to 22C show XPS spectra focusing on the 2p orbital of gallium contained in the samples. Further, FIGS. 23A to 23C show XPS spectra focusing on the 2p orbital of zinc contained in the samples. The spectra of both gallium and zinc are hardly affected by whether heat treatment is performed or the amount of nitrogen added to a gas introduced into a deposition chamber.

This application is based on Japanese Patent Application serial no. 2008-281752 filed with Japan Patent Office on Oct. 31, 2008, the entire contents of which are hereby incorporated by reference.

What is claimed is:

1. A display device comprising:
a pixel electrode,
wherein the pixel electrode comprises a conductive oxynitride containing indium, gallium, zinc, and hydrogen atoms.

2. The display device according to claim 1,
wherein in the conductive oxynitride, composition ratios of nitrogen (N) to oxygen (O) (N/O) range from 5 atomic % to 80 atomic %.

3. A method for manufacturing a conductive oxynitride film, comprising:
stacking an oxynitride film containing indium, gallium, and zinc over a film serving as a supply source of hydrogen atoms; and
performing heat treatment so that hydrogen atoms are diffused into the oxynitride film.

4. A method for manufacturing a conductive oxynitride film, comprising:
stacking an oxynitride film containing indium, gallium, and zinc over a film comprising a hydroxyl group such as a —SiOH group or a —AlOH group or over a film to which hydrogen is added; and
performing heat treatment so that hydrogen atoms are diffused into the oxynitride film.

5. The method for manufacturing a conductive oxynitride film, according to claim 3,
wherein the oxynitride film containing at least indium, gallium, and zinc is deposited by sputtering a target made from an oxide containing indium, gallium, and zinc in an atmosphere containing a nitrogen gas.

6. The method for manufacturing a conductive oxynitride film, according to claim 4,
wherein the oxynitride film containing at least indium, gallium, and zinc is deposited by sputtering a target made from an oxide containing indium, gallium, and zinc in an atmosphere containing a nitrogen gas.

7. A display device comprising:
a transistor over a substrate;
a channel formation layer included in the transistor; and
a pixel electrode,
wherein the pixel electrode comprises a conductive oxynitride containing indium, gallium, gallium, zinc, and hydrogen atoms, and
wherein the pixel electrode is electrically connected to the transistor.

8. A display device comprising:
a transistor over a substrate;
a channel formation layer included in the transistor;
a pixel electrode; and
a counter electrode over the substrate, the transistor, and the pixel electrode,
wherein the counter electrode comprises a conductive oxynitride containing indium, gallium, zinc, and hydrogen atoms.

9. The display device according to claim 1,
wherein the display device is a liquid crystal display device.

10. The display device according to claim 7,
wherein the display device is a liquid crystal display device.

11. The display device according to claim 8,
wherein the display device is a liquid crystal display device.

12. The display device according to claim 1,
wherein the display device is an electroluminescent display device.

13. The display device according to claim 7,
wherein the display device is an electroluminescent display device.

14. The display device according to claim 8,
wherein the display device is an electroluminescent display device.

15. The display device according to claim 1,
wherein the conductive oxynitride has an amorphous structure.

16. The method for manufacturing a conductive oxynitride film according to claim 3,
wherein the conductive oxynitride film has an amorphous structure.

17. The method for manufacturing a conductive oxynitride film according to claim 4,
wherein the conductive oxynitride film has an amorphous structure.

18. The display device according to claim 7,
wherein the conductive oxynitride has an amorphous structure.

19. The display device according to claim 8,
wherein the conductive oxynitride has an amorphous structure.

20. The display device according to claim 7,
wherein the channel formation layer comprises silicon.

21. The display device according to claim 8,
wherein the channel formation layer comprises silicon.

22. The display device according to claim 7,
wherein the channel formation layer comprises an oxide semiconductor.

23. The display device according to claim 8,
wherein the channel formation layer comprises an oxide semiconductor.

24. The display device according to claim 7,
wherein the channel formation layer comprises an oxide semiconductor containing indium.

25. The display device according to claim 8,
wherein the channel formation layer comprises an oxide semiconductor containing indium.

* * * * *